US010340416B2

(12) United States Patent
Jo et al.

(10) Patent No.: US 10,340,416 B2
(45) Date of Patent: Jul. 2, 2019

(54) CRYSTAL SUBSTRATE, ULTRAVIOLET LIGHT-EMITTING DEVICE, AND MANUFACTURING METHODS THEREFOR

(71) Applicant: RIKEN, Saitama (JP)

(72) Inventors: Masafumi Jo, Saitama (JP); Hideki Hirayama, Saitama (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 15/442,554

(22) Filed: Feb. 24, 2017

(65) Prior Publication Data

US 2017/0250308 A1 Aug. 31, 2017

(30) Foreign Application Priority Data

Feb. 26, 2016 (JP) ................................ 2016-036463
Feb. 14, 2017 (JP) ................................ 2017-024585

(51) Int. Cl.
*H01L 33/12* (2010.01)
*H01L 33/22* (2010.01)
(Continued)

(52) U.S. Cl.
CPC ............ *H01L 33/12* (2013.01); *H01L 33/007* (2013.01); *H01L 33/18* (2013.01); *H01L 33/22* (2013.01)

(58) Field of Classification Search
CPC ......... H01L 33/12; H01L 33/06; H01L 33/18; H01L 33/0075; H01L 33/22; H01L 33/32; H01L 33/405
(Continued)

(56) References Cited

U.S. PATENT DOCUMENTS 6,091,083 A * 7/2000 Hata ..................... H01L 33/007 257/190
6,342,748 B1 * 1/2002 Nakamura ......... H03H 9/02543 310/313 A (Continued)

OTHER PUBLICATIONS

Shibata, Tomohiko et al., "AlN epitaxial growth on off-angle R-plane sapphire substrates by MOCVD," J. Crystal Growth, 229, 63-68 (2001).

(Continued)

*Primary Examiner* — Anthony Ho
*Assistant Examiner* — Mohammad M Hoque
(74) *Attorney, Agent, or Firm* — Seed IP Law Group LLP

(57) ABSTRACT

To fabricate a practically useful non-polar AlN buffer layer on a sapphire crystal plate and manufacture a UV light-emitting device on a non-polar crystal substrate by adopting the crystal substrate as an example, an embodiment of the present invention provides a crystal substrate 1D comprising an r-plane sapphire crystal plate 10 and an AlN buffer layer 20D of non-polar orientation. The AlN buffer layer comprises a surface protection layer 22 and a smoothing layer 26. The surface protection layer suppresses roughness increase on a surface of the AlN buffer layer, and the smoothing layer makes the surface of the AlN buffer layer a smoothed surface. Also provided is a crystal substrate 11 comprising an AlN buffer layer 20T to which a dislocation blocking layer 24 for reducing crystallographic defects is added between the surface protection layer 22 and the smoothing layer 26. In another embodiment a deep UV light-emitting device is provided.

15 Claims, 14 Drawing Sheets

1000 160 150 138 136 134 130 140 132 120 101 110 114 112 L

(51) Int. Cl.
*H01L 33/18* (2010.01)
*H01L 33/00* (2010.01)

(58) Field of Classification Search
USPC .......................................................... 438/587
See application file for complete search history.

(56) References Cited

U.S. PATENT DOCUMENTS 8,026,118 B2* 9/2011 Shinohara ............... H01L 33/38 257/103
9,153,741 B1* 10/2015 Hirayama ............... H01L 33/32
2006/0261371 A1* 11/2006 Kuroda ............... H01L 21/0237 257/194
2009/0057646 A1* 3/2009 Hirayama ........... H01L 21/0237 257/13
2010/0193843 A1* 8/2010 Lee ................... H01L 21/02378 257/201
2010/0213436 A1* 8/2010 Khan ................ H01L 21/02433 257/13
2010/0219395 A1* 9/2010 Hirayama .............. H01L 33/06 257/13
2010/0264401 A1* 10/2010 Adivarahan ............ H01L 33/12 257/13
2010/0320440 A1* 12/2010 Khan ..................... B82Y 20/00 257/13
2011/0012089 A1* 1/2011 Khan ...................... H01L 33/12 257/13
2011/0017976 A1* 1/2011 Khan ..................... B82Y 20/00 257/13
2011/0024722 A1* 2/2011 Moustakas ........ H01L 21/02378 257/13
2011/0127571 A1* 6/2011 Khan .................. C23C 16/4488 257/103
2011/0198567 A1* 8/2011 Shinohara ............. H01L 33/025 257/13
2012/0097922 A1* 4/2012 Masuya .................. H01L 33/42 257/13
2012/0319162 A1* 12/2012 Araki .................. H01L 21/0237 257/103
2012/0325310 A1* 12/2012 Chichibu ............. C23C 14/083 136/256
2013/0069034 A1* 3/2013 Hirayama ............... H01L 33/04 257/13
2014/0131726 A1* 5/2014 Lee ........................ H01L 33/32 257/76
2014/0227864 A1* 8/2014 Okuno ................ H01L 21/0254 438/488
2015/0125976 A1* 5/2015 Wang ................ H01L 21/02381 438/26
2015/0357521 A1* 12/2015 Choe ....................... H01L 33/32 257/103
2015/0372190 A1* 12/2015 Hirayama ............... H01L 33/32 257/99
2016/0218183 A1* 7/2016 Choe ................. H01L 21/02378
2016/0343903 A1* 11/2016 Ueta ....................... H01L 33/12
2017/0110852 A1* 4/2017 Mino .................. H01S 5/34346

OTHER PUBLICATIONS

Miyagawa, Reina et al., "a-plane AlN and AlGaN growth on r-plane sapphire by MOVPE," Phys. Status Solidi C 7, No. 7-8, 2107-2110 (2010); DOI 10.1002/pssc.200983601.

Bryan, Isaac et al., "Homoepitaxial AlN thin films deposited on m-plane (11-00) AlN substrates by metalorganic chemical vapor deposition," J. Appl. Phys. 116, 133517 (2014); http://dx.doi.org/10.1063/1.4897233.

Hirayama, Hideki et al., "222-282 nm AlGaN and InAlGaN-based deep-UV LEDs fabricated on high-quality AlN on sapphire," Phys. Stat. Solidi (a), 206, 1176-1182 (2009).

* cited by examiner

1500°C

1400°C

1300°C

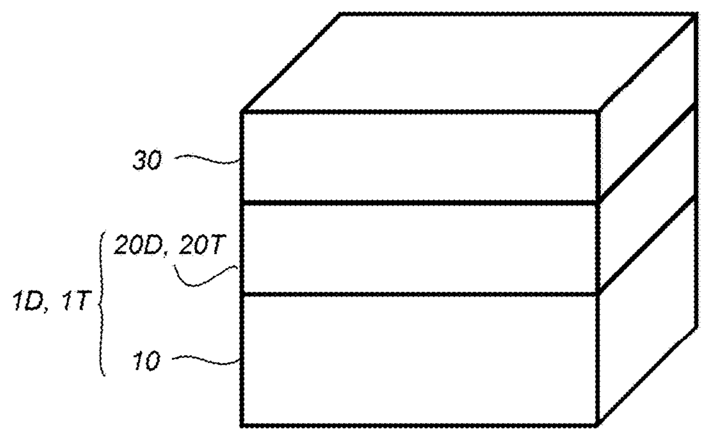
FIG. 10
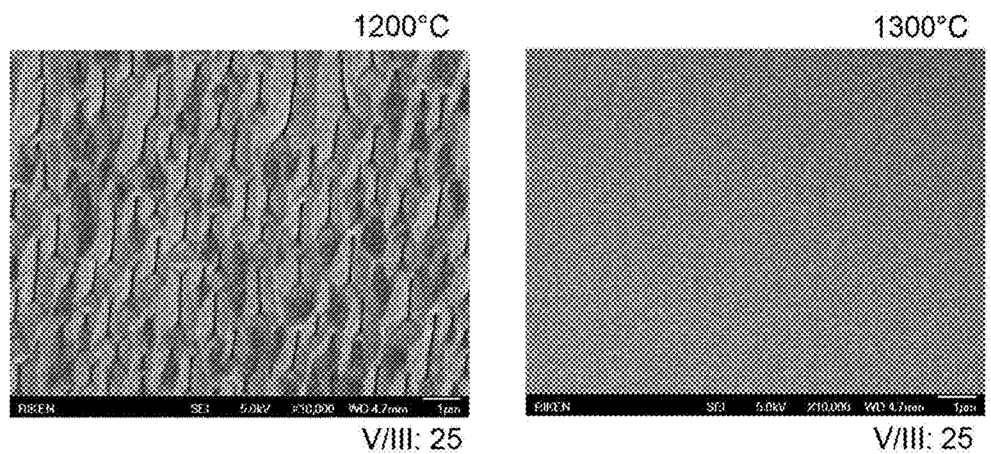
FIG. 11A
FIG. 11B

CRYSTAL SUBSTRATE, ULTRAVIOLET LIGHT-EMITTING DEVICE, AND MANUFACTURING METHODS THEREFOR

CROSS-REFERENCE TO RELATED APPLICATIONS

This application is based upon and claims the benefit of priority to Japanese Patent Application No. 2016-036463, filed on Feb. 26, 2016, and Japanese Patent Application No. 2017-024585, filed on Feb. 14, 2017, the contents of which are incorporated herein by reference in their entirety.

BACKGROUND OF THE INVENTION

Technical Field

The present invention relates to a crystal substrate, an ultraviolet (UV) light-emitting device, and manufacturing methods therefor. More specifically, the present invention relates to a crystal substrate suitable for fabricating devices using a group-III nitride semiconductor crystal, a UV light-emitting device using group-III nitride semiconductor crystal, and manufacturing methods therefor.

Background

Functional devices such as blue light emitting diodes (LEDs) and blue laser diodes (LDs) have been reduced into practice by adopting a crystal of group-III nitride semiconductor, a type of compound semiconductors. Radiation of shorter wavelength than blue light has been sought in the field of solid state light sources, ultraviolet light-emitting diodes (UVLEDs) have been developed accordingly. In particular, ultraviolet (UV) light in a deep UV wavelength range, or a wavelength range below 350 nm, are considered useful in many applications. Since light of 260-280 nm range in the deep UV, a part of a UV-C wavelength range, have vast applications including sterilization, water purification, and medical applications, thus LEDs for the UV-C wavelength range, or deep ultraviolet LEDs (DUVLEDs) have been developed. Typical DUVLED uses a sapphire crystal plate or an AlN single crystal substrate and is made to form a layered structure of gallium-aluminum nitride (AlGaN) system semiconductor, whose main elements are aluminum (Al), gallium (Ga), and nitrogen (N). Improvement of output power of DUVLEDs is in progress; DUVLEDs with UV output level of ~10 mW have been manufactured to date.

Technological challenges for such UVLEDs include improvement of emission efficiency. The improvement has been eagerly sought by, for example, fabricating quantum well structures into an emission layer, or by adopting a non-polar plane, which may enable increase of overlap of wavefunctions between electrons and holes. Concerning ease of the crystal growth, (0001) plane growth or c-plane growth is advantageous; however, it produces polarization along a thickness direction caused by difference in electronegativity. When such polarization is present, wavefunctions for electrons and holes begin to separate from each other as if they feel repulsion along a thickness direction due to their opposite electric polarity, and it results in degradation of recombination probability in the emission. In addition, when an electron blocking layer is fabricated, tunneling probability becomes high due to the polarization, which may lead to increase of overflow of electrons. Moreover, since a gradation of an electric field is susceptible to a carrier density, an emission wavelength may shift by variation of a driving electric current.

When manufacturing a DUVLED by using a non-polar plane as an example of manufacturing devices of group-III nitride semiconductor, it is favorable that aluminum nitride (AlN) is formed before the growth, as AlN may exert a compression strain in the final device. Therefore, it is advantageous if a non-polar AlN buffer layer is disposed on a readily available sapphire crystal plate. Typical types of a non-polar AlN buffer layer that can be adopted in this application are AlN layers of (1-100) plane and (11-20) plane, which may be referred to as an "m-AlN layer" and "a-AlN layer" respectively in this application. Among these types, the m-AlN layer is so difficult to manufacture that only homo epitaxial growth on an expensive AlN wafer has been reported so far. In contrast, the a-AlN layer can be provided with fairly good lattice matching capability when it is disposed on (1-102) plane sapphire crystal plate, or "r-sapphire crystal plate".

RELATED ART REFERENCES

Non-Patent Documents

Non-Patent Document 1: Tomohiko Shibata et. al., "AlN epitaxial growth on off-angle R-plane sapphire substrates by MOCVD," J. Crystal Growth, 229, 63-68 (2001)

Non-Patent Document 2: Reina Miyagawa et. al., "a-plane AlN and AlGaN growth on r-plane sapphire by MOVPE," Phys. Status Solidi C 7, No. 7-8, 2107-2110 (2010); DOI 10.1002/pssc.200983601

Non-Patent Document 3: Isaac Bryan et. al., "Homoepitaxial AlN thin films deposited on m-plane (11-00) AlN substrates by metalorganic chemical vapor deposition," J. Appl. Phys. 116, 133517 (2014); http://dx.doi.org/10.1063/1.4897233

Non-Patent Document 4: H. Hirayama et al., "222-282 nm AlGaN and InAlGaN-based deep-UV LEDs fabricated on high-quality AlN on sapphire," Phys. Stat. Solidi (a), 206, 1176, (2009)

SUMMARY OF THE INVENTION

Technical Problem

Against the background explained above, growth of an a-AlN layer for the buffer on the r-sapphire crystal plate has been studied. However, it has been observed that pillars begin to emerge in the mid of the a-AlN layer growth, which eventually produces a rough surface (see, for example, Non-Patent Document 1). Moreover, it is favorable to adopt a relatively high temperature treatment in manufacturing a flat surface of the a-AlN layer. However, the surface of the r-sapphire crystal plate is roughened due to loss of oxygen if the temperature is set to 1300° C. or above.

Furthermore, detailed conditions for growing a non-polar surface or the like of a group-III nitride semiconductor crystal layer, such as AlGaN using a surface of a non-polar AlN crystal surface, or "non-polar AlN surface," have never been studied to date. It has never been reported for the time being that emission efficiency in the manufactured DUVLEDs has been improved, or that the emission wavelength shift has been prevented when a non-polar plane is used for the r-sapphire crystal plate. The present inventors have found through study of an actual growth of an AlGaN layer of a-plane (a-AlGaN), one of non-polar plane, that there is a problem in controlling a composition of AlN (Al composition ratio) to a desired value in a mixed crystal of AlN and GaN. It is imperative to control the Al composition ratio when manufacturing functional devices that use the group-III nitride semiconductor crystal layer.

The present invention provides a crystal substrate suitable for a template that is sufficiently useful for growing a high quality non-polar group-III nitride semiconductor crystal onto an r-sapphire crystal plate, and a method for controlling the composition applicable to manufacturing devices with a non-polar group-III nitride semiconductor crystal. The present invention thereby contributes to performance improvement of group-III nitride semiconductor devices.

Solution to Problem

The present inventors conceived of a manufacturing process that is divided into a plurality of steps for improving quality of the a-AlN buffer layer to be grown on the r-sapphire crystal plate. And then the present inventors succeeded in improving the quality of the non-polar AlN buffer layer by optimizing the growth conditions for each of the steps for the a-AlN layer growth on the r-sapphire crystal plate.

That is, in one aspect of the present invention provided is a crystal substrate that comprises a sapphire crystal plate of an r-plane orientation, and an AlN buffer layer of a non-polar orientation covering at least a part of a surface of the sapphire crystal plate. The AlN buffer layer comprises a surface protection layer and a smoothing layer, both of which are epitaxially grown layers made of AlN crystal, in this order from the sapphire crystal plate side. The surface protection layer is configured to suppress roughness increase on a surface of the AlN buffer layer. The smoothing layer is configured to provide a smoothed surface for a surface of the AlN buffer.

Furthermore, the present inventors conceived of a method of growing a high quality crystal even for an AlGaN layer of non-polar plane, where its growth can be carried out on a surface of a high quality non-polar AlN buffer layer mentioned above or on a surface of an AlN crystal of a non-polar plane ("non-polar AlN surface"), and then confirmed that performance of an ultraviolet light emitting device was actually improved.

That is, in another aspect of the present invention provided is a method for manufacturing a crystal substrate of a non-polar orientation comprising a step of providing a sapphire crystal plate of an r-plane orientation, and a step of forming a buffer layer of an AlN buffer layer, so that the AlN buffer layer covers at least a part of a surface of the sapphire crystal plate, the AlN buffer layer being an epitaxially grown layer of AlN crystal of a non-polar orientation. The step of forming a buffer layer comprises a step of forming a surface protection layer by epitaxially growing a surface protection layer that suppresses roughness increase on a surface of the AlN buffer layer, and a step of smoothing by epitaxially growing a smoothing layer for providing a surface of the AlN buffer with a smoothed surface.

In any aspect of the present invention, a crystal substrate means a plate shape object of a single or poly crystal for suspending purpose or supporting shape to be used in an arbitrary application field. The application field for the crystal substrate having a sapphire crystal plate and an AlN buffer layer is typically, but is not limited to, a UV light-emitting diode or a UV laser diode. Notations of planes by Miller indices, including crystal planes referred to as r-plane as an example, are those used in crystallography. In this regard, however, a geometrical perfection when specifying planes by the Miller indices is not always required in this application. That is, not only intentional errors from the definition, such as inclination often introduced for helping crystalline growth or so called "off angle", but also unintentional errors due to actual manufacturing process may occur and will fall within the claims.

When an AlN buffer layer covers at least part of a surface the sapphire substrate in any aspect of the present application, it means that such an AlN buffer layer is disposed on at least part of the sapphire substrate's surface directly or indirectly, i.e., via an unspecified crystal layer. If the sapphire substrate has a plate shape having a pair of surfaces defining its thickness, the at least part of the surface of the sapphire substrate in this regard may include a whole part of, or a part of, one of the surfaces. In this application, a mixed crystal of AlN and GaN may be referred to as AlGaN, and a mixed crystal of $(AlN)_x$ and $(GaN)_{1-x}$ may be referred to as $Al_xGa_{1-x}$ N. It should also be noted that a mixed crystal of AlN and GaN may include other composition than AlN or GaN, such as InN, or dopants for controlling conduction carrier types such as Mg and Si.

When an ultraviolet light-emitting device is mentioned in this application, it may mean an ultraviolet laser diode as well as an ultraviolet light-emitting diode. The ultraviolet light-emitting diode (hereinafter "UVLED"), a typical device of the ultraviolet light-emitting devices, is a light-emitting diode that radiates electromagnetic wave in an ultraviolet range, or ultraviolet light. Types of UVLEDs for a deep ultraviolet range, sometimes referred to as DUV-LEDs in this application, are also members of UVLEDs in this context. Similarly, an ultraviolet laser diode, which may be an example type of light-emitting diodes, is a laser diodes that radiates electromagnetic wave through a stimulated emission process in an ultraviolet range (ultraviolet light). It should be noted that terminologies for optics, such as "light", "light source", "emission", or "light extraction" are used in this application also for describing electromagnetic radiation in a range of ultraviolet even though the radiation is not included in the visible range.

Furthermore, an ultraviolet (UV) emission layer is typically a layered structure of AlGaN layer. That is, the UV emission layer is a layered structure each of which layers has a composition of $Al_yGa_{1-y}N$ (where y is a value in $0 \leq y \leq 1$, allowing for additional component), where a tiny amount of elements (dopant) for making conduction carrier type positive or negative can be added as necessary. The UV emission layer is generally manufactured by stacking an n-type conduction layer, a recombination layer, and a p-type conduction layer in this order, while an additional layer or layers may be combined. The additional layer mentioned here may mean an electron blocking layer, disposed between the p-type conduction layer and a reflection electrode, and a p-type contact layer. These additional layers may also be manufactured into layered structures.

Advantageous Effect of the Invention

According to any aspect of the present invention, it is possible to manufacture a crystal substrate having a high quality non-polar AlN buffer layer by adopting an r-plane sapphire crystal plate. Moreover, in any aspect of the present invention, a non-polar AlGaN layer with a controlled composition can be manufactured, thereby a high performance UV emission device using a group-III nitride semiconductor crystal is provided.

BRIEF DESCRIPTION OF THE DRAWINGS

FIG. 10 is a schematic diagram illustrating a structure in the case when a non-polar AlGaN layer is grown on a surface of a crystal substrate having an AlN buffer layer formed on a sapphire crystal plate in an embodiment of the present invention.

FIGS. 11A and 11B depict SEM micrographs of top-most surfaces of AlGaN layers grown with a V/III ratio of 25 at 1200° C. and 1300° C. respectively, in an example for an embodiment of the present invention.

DESCRIPTION OF THE EMBODIMENT

Figure 1:
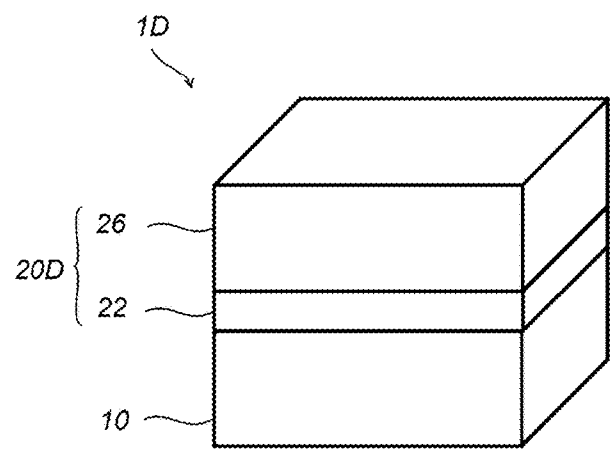
FIG. 1 is a schematic diagram illustrating a structure of a crystal substrate having a two-step-grown AlN buffer layer, which is grown by two steps on a sapphire crystal plate, in an embodiment of the present invention.

Embodiments regarding an ultraviolet light-emitting device and method of manufacturing thereof will be described by way of illustration of an ultraviolet light-emitting device (UVLED) based on accompanying drawings. For all drawings, the common reference signs are given to common parts or elements unless otherwise noted. In addition, each element in the drawing should be understood as not being drawn to scale.

1. First Embodiment: Crystal Substrate

In the present embodiment, a crystal substrate with an r-sapphire crystal plate on which a high quality AlN buffer layer is grown is provided. The a-AlN layer continues to grow on the r-sapphire crystal plate while [0001] and [1-100] directions of the a-AlN layer are kept parallel respectively to [1-101] and [11-20] directions of the sapphire substrate. A good quality a-AlN buffer can be grown with a compression strain as a whole, where lattice constant misfits against the a-AlN layer are those that correspond to 3% tensile strain along [0001] direction and 11.6% compression strain along [1-100] direction.

When an a-sapphire crystal plate is adopted and processed at 1300° C. or above, the surface of the sapphire will have a severely roughened surface, as mentioned above (Non-Patent Document 2). In addition, it has been pointed out that the process temperature is important in the case of homo epitaxial growth of an m-AlN crystal on a supporting substrate of the same lattice plane, even though the m-AlN crystal is different from a-AlN layer and is not of our concern (Non-Patent Document 3). According to Non-Patent Document 3, it is necessary to perform growth at a relatively high temperature, 1450° C. or above, for having a flat surface of the m-AlN crystal in atomic level. The present inventors attempted formation of an a-AlN crystal on an r-sapphire crystal plate and acquired knowledge on the growth, especially in a growth temperature and related conditions. In particular, a multiple step growth with different growth conditions in steps has been studied for the growth of an a-AlN crystal buffer made of an a-AlN crystal. It should be noted in the present embodiment that a sapphire crystal plate means an r-sapphire crystal plate, whereas the AlN layer means an a-AlN buffer layer or an AlN buffer layer made of a-AlN layer, unless otherwise noted.

1-1. Improvement of Temperature Resistance of Sapphire Crystal Plate: Two-Step-Grown AlN Buffer Layer Attempts have been made on suppressing the roughening on a surface of a sapphire crystal plate, which may be an obstacle growth of AlN layer in a high temperature. What was studied in the first place was a two-step growth of epitaxy of an AlN buffer layer: growth of an AlN layer, a surface protection layer, for protecting the surface of underlying sapphire crystal layer, and growth of another layer, a smoothing layer, for providing a smoothed surface for the AlN layer. FIG. 1 is a schematic diagram illustrating a structure of a crystal substrate 1D having a two-step-grown AlN buffer layer 20D, which is grown in the two-step process on a sapphire crystal plate 10.

The sapphire crystal plate 10 had a surface of (1-102) plane with an off angle of 0.5°. A surface protection layer 22 and a smoothing layer 26 were grown on one of the surfaces thereof by an MOCVD method with various conditions to obtain a two-step-grown AlN buffer layer 2D. The surface protection layer 22 having a thickness of 30 nm was made while the growth temperature, the temperature of the substrate, was set to 1100° C. through this study. The smoothing layer 26 was then made to have a thickness of 2 while the temperature was changed in a range 1300-1500° C. for each test sample. Pressure conditions for these layers were set to 76 Torr ($1.013\times10^4$ Pa).

Figure 2A:
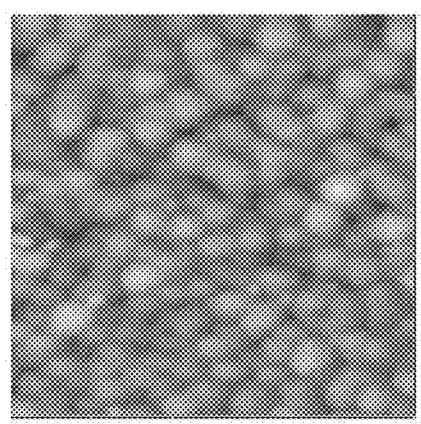
FIGS. 2A and 2B depict atomic force microscopy (AFM) micrographs of surfaces of surface protection layers in as-grown condition at 1100° C. and one with additional anneal at 1500° C. respectively, in an embodiment of the present invention.
Figure 2B:
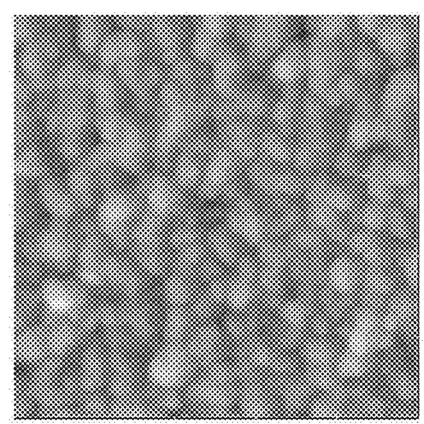

In the case when the surface protection layer 22 was grown by raw material gas with a VIII ratio of 5000:1, a AlN domain with small islands was formed with a temperature condition at 1100° C. The V/III ratio in this context is a supply ratio between gas for a group-V element (ammonia) and gas for a group-III element (TMAl), and is denoted by a ratio of, for example, 5000:1 for group-V element: group-III element, which may be abbreviated into a VIII ratio of 5000. FIGS. 2A and 2B depict atomic force microscopy (AFM) micrographs of surface protection layers of samples obtained by as-grown condition at 1100° C. (FIG. 2A) and another sample to which anneal at 1500° C. was added thereafter (FIG. 2B). The AFM micrographs in FIGS. 2A and 2B were captured over an area of 1 μm No noticeable morphology change was observed on the surface protection layer 22 of AlN that had been heated to 1500° C. as are shown in FIGS. 2A and 2B. Based on this result, surface roughening suppression effect on r-sapphire surface by the grown surface protection layer 22 was confirmed for the temperature conditions at around 1500° C. or below. It should be noted that the temperature condition of 1500° C. is usually within a normal operation range for MOCVD apparatus, thus there are few problems when practicing the condition. Also, it is possible to grow the surface protection layer 22 at a temperature higher than this, so long as the temperature adopted is below a decomposition temperature of AlN.

Figure 3C:
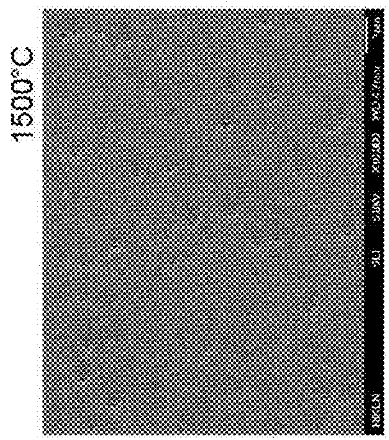
FIGS. 3A-3C depict scanning electron microscopy (SEM) micrographs of surfaces of smoothing layers grown condition at 1300° C., 1400° C., and 1500° C. respectively, in an embodiment of the present invention.
Figure 3B:
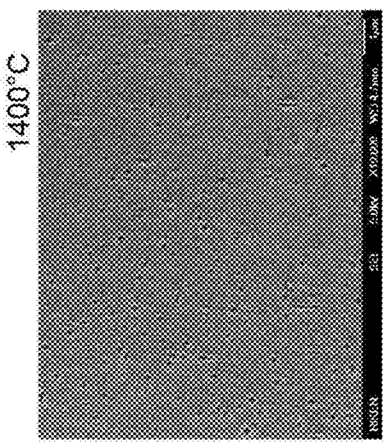
Figure 3A:
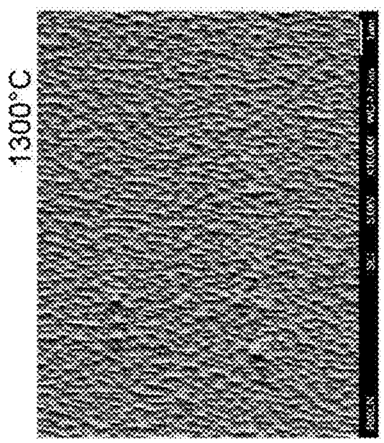

For growing the smoothing layer 26 following the surface protection layer 22, an optimal condition to have smoothed surface of the AlN layer was sought by changing settings of the growth temperature and the V/III ratio. First, the growth temperature was varied while fixing the V/III ratio to 50 for comparing grown surfaces. FIGS. 3A-3C depict scanning electron microscope (SEM) micrographs of surfaces of smoothing layers grown at 1300° C., 1400° C., and 1500° C. respectively. According to the comparison among 1300° C., 1400° C., and 1500° C., it was confirmed that the higher the growth temperature was, the smoother the surface became. In particular, small bumps were found on the surface of the smoothing layer 26 grown at 1300° C., which result in a frost-mirror like appearance on the surface of the AlN layer when inspected visually. In contrast, good mirror like surfaces were observed for ones grown at 1400° C. and 1500° C. with visual inspection. However, as can be indicated in SEM micrographs in FIGS. 3B and 3C, void-like structural defects were observed for ones grown at 1400° C. and 1500° C., and the density of such defects decreased according to the growth temperature raise, as $1\times10^8$ $cm^{-2}$ for 1400° C. and $3\times10^7$ $cm^{-2}$ for 1500° C. We believe that enhanced diffusion of Al atoms due to the higher temperature could account for this phenomenon. It should be noted that the surface roughening at a high temperature of the sapphire crystal plate 10 was still suppressed due to the surface protection layer 22; therefore, the roughening did not cause any problem when growing the smoothing layer 26 in a 1300° C.-1500° C. range. If we recall reported facts that sapphire was roughened at a high temperature (Non Patent Documents 1 and 2), it should be concluded that the actual function of the surface protection layer 22 is demonstrated by the fact that such roughening in the present embodiment did not affect the growth of the smoothing layer 26.

To have much higher quality surface by controlling the diffusion of Al atoms, we carried out manufacturing process of the two-step-grown AlN buffer layer 20D on the crystal substrate 1D while the V/III ratio is changed. FIGS. 4A-4D depict SEM micrographs of surfaces of smoothing layers grown with V/III ratios of 12.5, 50, 500, and 5000 respectively. The purpose of this study is to control the diffusion behavior of Al atoms on the surface by way of the V/III ratio. Concerning the other conditions for growing the smoothing layer 26, the growth temperature was fixed to 1500° C. and a feed rate of gas for the group-III element, or TMAL, was also fixed to 20 sccm. Conditions for growing the surface protection layer 22 were unchanged.

As indicated in FIG. 4, the lower the V/III ratios were, such as from 5000 to 500 and further to 50, the smaller the size of each defect of voids on the surface of the smoothing layer 26 became, as well as the lower the density of the defects became. We confirmed from this that the surface of the smoothing layer 26 could be smoothened when the V/III ratio is reduced to around 50. We believe this smoothening is attributable to enhanced diffusion of Al atoms caused by the VIII ratio reduction, where the reduction causes shifts in conditions in a same manner as those caused by the growth temperature raise. However, when the V/III ratio was drastically reduced, such as to 12.5, a wave structure was present, which resulted in a non-flat surface, as indicated in FIG. 4A. The wave structure had an uneven profile along <0001> axis direction, plausibly caused by imbalance in growth rates between +c and −c planes inherent to a non-polar plane. This means that there should be an optimal value for the V/III ratio for the growth on the non-polar plane. It is to be noted that, a V/III ratio for the surface protection layer 22 will be concluded as sufficient as long as it has a surface protection capability, and that the ratio should not be limited by a specific condition.

Figure 4A:
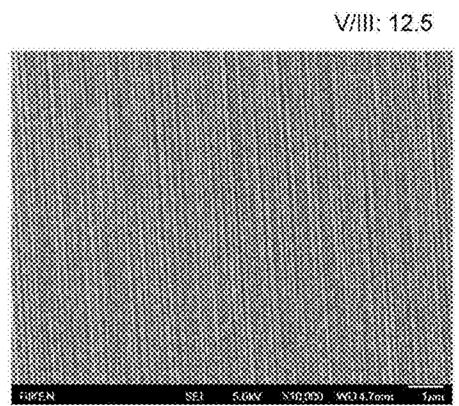
FIGS. 4A-4D depict SEM micrographs of surfaces of smoothing layers grown with V/III ratios of 12.5, 50, 500, and 5000 respectively, in an embodiment of the present invention.
Figure 4B:
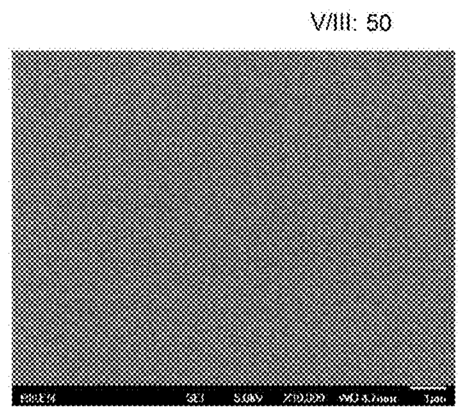
Figure 4C:
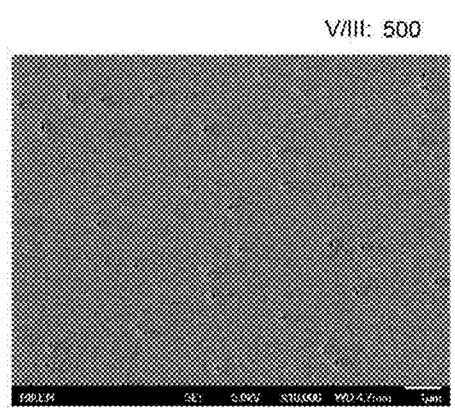
Figure 4D:
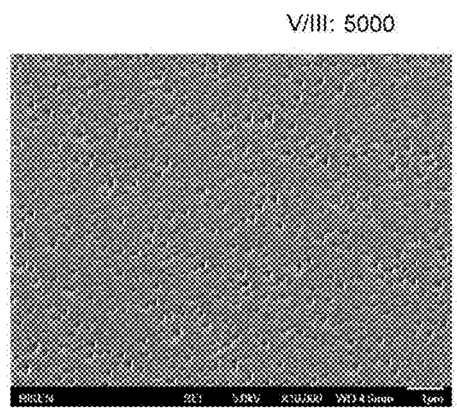
Figure 5:
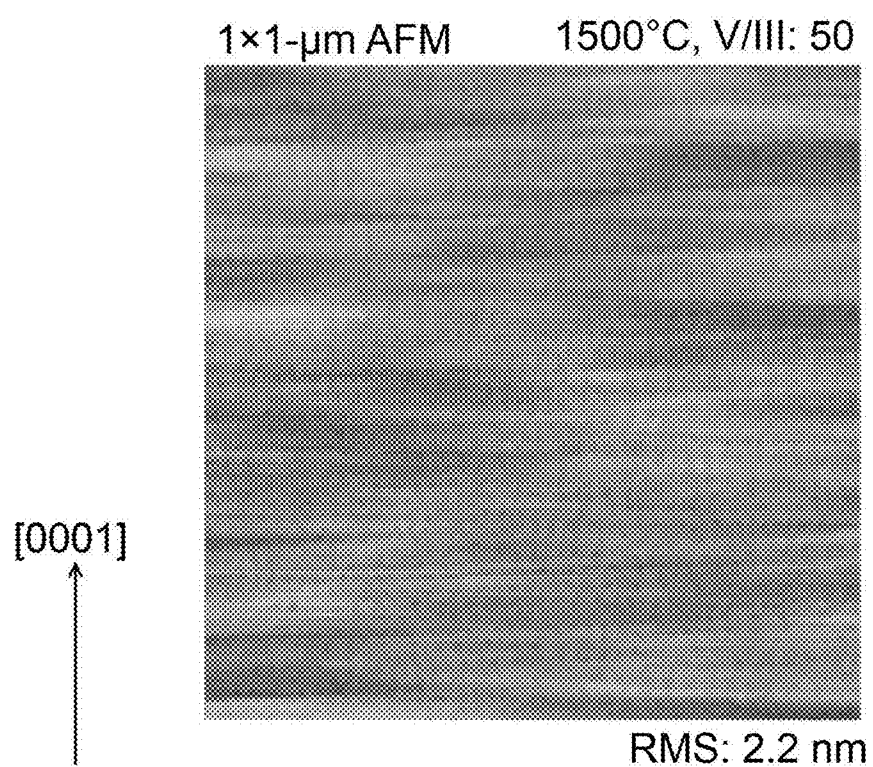
FIG. 5 is an AFM micrograph of a surface of a crystal substrate sample having a smoothing surface grown with a condition with which a smooth surface is obtained in an embodiment of the present invention.

The surface of a sample for the crystal substrate 1D was observed by AFM, where the sample had a smoothing layer 26 that had been grown with a V/III ratio of 50 and a growth temperature of 1500° C. (FIG. 4B). FIG. 5 is an AFM micrograph of a surface of a sample for the crystal substrate 1D (FIG. 4B). The AFM micrograph in FIG. 5 was captured over an area of 1 μm×1 μm. We confirmed that the surface of the smoothing layer 26 obtained with a V/III ratio of 50 was extremely flat with a root-mean-square (RMS) roughness of 2.2 nm. Here the RMS roughness value is calculated as follows:

$$Rq=(\Sigma_i(z_i-z_{ave})^2)^{1/2}/N,$$

where N denotes a total number of measurement points in a measurement area; $z_i$ a height value at each measurement point, identified by an index i, in the measurement area; $z_{ave}$ an average value of $z_i$ over the measurement area; and $\Sigma_i$ a summation operation through the indices i. When the RMS roughness is 10 nm or below, manufacturing an emitting device, including fabrication of quantum wells, becomes easy. It is preferable that the RMS roughness be 3 nm or below, as it provides sharp interfaces for the fabricated quantum wells.

As stated above, we succeeded in manufacturing a crystal substrate 1D comprising a two-step-grown AlN buffer layer 20D with a flat surface having a surface protection layer 22 and a smoothing layer 26 on an r-sapphire crystal plate 10. The RMS roughness value of 2.2 nm shows that it has a sufficient flatness for a template on which a device is to be manufactured using a group-III nitride semiconductor crystal having such quantum structure as quantum wells.

1-2. Improvement on Compatibility Between Crystal Quality and Flatness: Three-Step-Grown AlN Buffer Layer In the second place, crystallinity of the AlN buffer layer for the crystal growth was studied for the purpose of further improving the quality of a crystal that is to be grown subsequently using the AlN buffer layer as a template. The study was conducted on conditions for the two-step-grown AlN buffer layer 20D, or the condition of a V/III ratio of 50 from which the AFM micrograph of FIG. 5 had been obtained. The growth temperature has been changed through the study in a range up to 1500° C. to obtain knowledge on the conditions' compatibility with fairly good flatness mentioned above.

Figure 6:
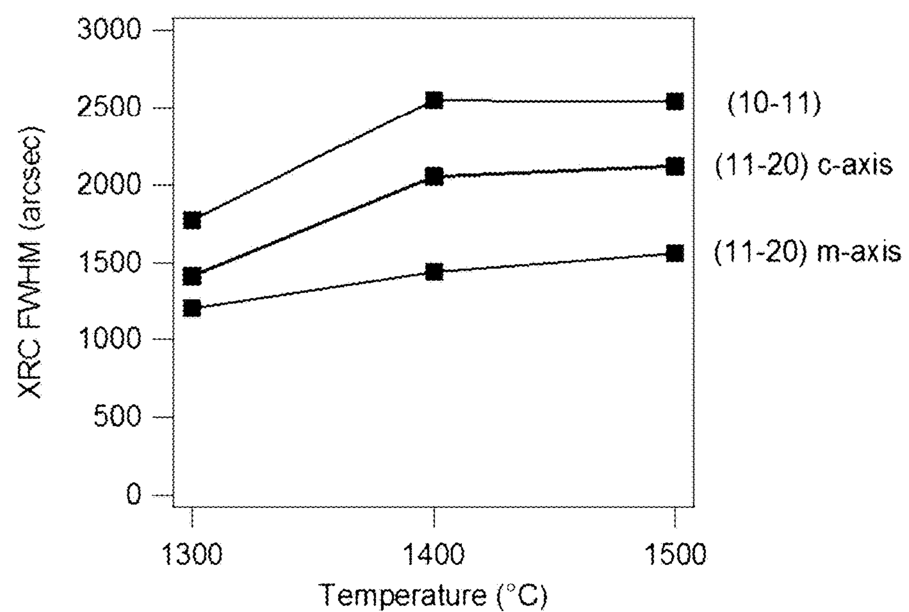
FIG. 6 is a graph indicating relationships between growth temperatures of AlN buffer layers on a sapphire crystal plate and full width half maximum values of X-ray diffraction peaks in an embodiment of the present invention.

FIG. 6 is a graph indicating relationships between growth temperatures of AlN buffer layers on a sapphire crystal plate 10 and full width half maximum (FWHM) values of X-ray diffraction peaks. The FWHM values for the X ray diffraction peaks are calculated from X ray rocking curves in ω-scan mode, where the curves have been measured for samples fabricated at growth temperatures of 1300° C., 1400° C., and 1500° C. along c- and m-axes directions on a-plane, or (11-20) plane, and (10-11) plane, which is a semi-polar plane. As can be seen from values for the FWHM, narrower peaks in the X-ray diffraction corresponding to good crystalline quality were obtained from AlN buffer layers grown at a lower temperature within a growth temperature range of 1300-1500° C. than peaks from ones grown at a higher temperature. Considering this result, we supposed it should be possible to improve the crystallinity of the smoothing layer 26 further, even if the smoothing layer 26 had a flat surface by way of high temperature growth (1500° C.) as in the two-step-grown AlN buffer layer 20D for the crystal substrate 1D.

Figure 7:
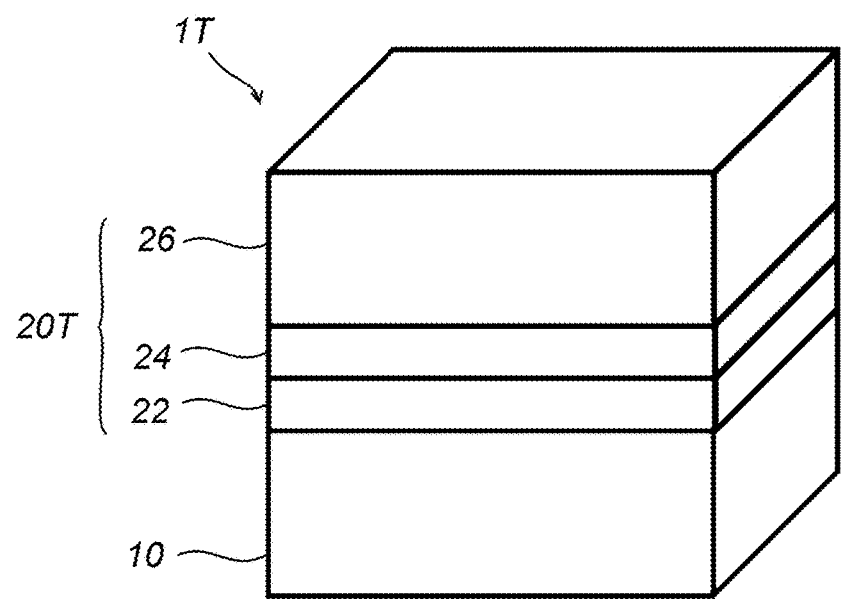
FIG. 7 is a schematic diagram illustrating a structure of a three-step-grown AlN buffer layer having an additional AlN layer (dislocation blocking layer) between the surface protection layer and the smoothing layer, in an embodiment of the present invention.

Based on the study mentioned above, we then expected that the crystallinity and the flatness could be compatible with each other if we practice a three-step growth, in which an additional AlN layer is to be disposed between the surface protection layer 22 and the smoothing layer 26. FIG. 7 is a schematic diagram illustrating a structure of a three-step-grown AlN buffer layer 20T having an additional AlN layer, or a dislocation blocking layer 24, between the surface protection layer 22 and the smoothing layer 26. The three-step-grown AlN buffer layer 20T has epitaxially grown layers of a surface protection layer 22, a dislocation blocking layer 24, and a smoothing layer 26, in this order on a sapphire crystal plate 10. Manufacturing condition of the dislocation blocking layer 24 was studied for having a further suitable template on the surface of the smoothing layer 26 in the three-step-grown AlN buffer layer 20T.

A function expected to be performed by the dislocation blocking layer 24 in the three-step-grown AlN buffer layer 20T is to suppress crystallographic defects during the growth, or dislocations in particular, i.e., to block threading dislocations. That is, the dislocation blocking layer 24 is grown right after the formation of the island structure (FIG. 2) on the surface protection layer 22. Therefore, the crystal of the surface protection layer 22 is inferior in flatness on the surface, even though the dislocation blocking layer 24 is grown while having a fairly high coherence to the crystal lattice of the sapphire crystal plate 10. When a smoothing layer 26 is grown on the surface protection layer 22 at a high temperature (e.g., a growth temperature of 1500° C.), as in the two-step-grown AlN buffer layer 20D, then sufficient flatness is achieved; however, crystallinity will be the same as one obtained for the surface protection layer 22 at that time. Therefore we suppose that, if the crystallinity of the surface protection layer 22 is improved further by using a dislocation blocking layer 24 to be grown subsequently thereon, it would be possible to obtain sufficient crystallinity and flatness at a time, as the smoothing layer 26 should have a sufficient smoothing capability.

Growth condition required for growing the dislocation blocking layer 24 is one that produces a high crystallinity in the growth without necessity of strong smoothing capability as required for the smoothing layer 26. It is advantageous to grow at a low temperature in a range between 1300-1500° C., as indicated in FIG. 6. However, the growth temperature (T1) for the surface protection layer 22 was set to a temperature that did not roughen the surface of the sapphire crystal plate 10. Since there was no problem for the two-step-grown AlN buffer layer 20D even when the smoothing layer was grown at a high temperature, the growth temperature (T2) for the dislocation blocking layer 24 can be set to the growth temperature T1 for the surface protection layer 22 or above. In addition, it is not favorable to set the growth temperature T2 for the dislocation blocking layer 24 as high as the growth temperature (T3) for the smoothing layer 26, as it produces smoothing effect similarly as the smoothing layer 26. As a result of these relationships, a preferable relationship found among the growth temperature values is expressed as:

$$T1 \leq T2 < T3.$$

The relationship mentioned above involves more preferable relationships as:

$$T1 \leq 1200^\circ \text{ C.},$$

$$T1 \leq T2 \leq 1300^\circ \text{ C., and}$$

$$1400^\circ \text{ C.} \leq T3.$$

That is, the growth temperature T1 for the surface protection layer 22 is preferably set to 1200° C. or below, as it should be determined for preventing roughening the surface of the sapphire crystal plate 10. However, since the crystallinity of AlN is good when the temperature is set over 1100° C., the lower limit of the growth temperature T1 for the smoothing layer 22 is determined while considering such crystallinity. The growth temperature T3 for the smoothing layer 26 is set to 1400° C. or above so that the smoothing mechanisms may take effect. Then, the growth temperature T2 for the dislocation blocking layer 24 is set to 1300° C. or below for minimizing the smoothing effect, but to the same as the growth temperature T1 for the surface protection layer 22 or above so that the good crystal can be grown. The growth temperature T2 for the dislocation blocking layer 24 is more preferably set to a further lower temperature and near to the growth temperature T1 for the surface protection layer 22 for improving dislocation blocking capability, because smoothing effect could be observed near 1300° C.

Other settings than the temperature can be determined according to functions for layers mentioned above. It is preferable that a VIII ratio that produces island structure be adopted for growth conditions of the surface protection layer. There should be an allowance to some extent in the V/III ratio for growing the dislocation blocking layer 24.

Typical manufacturing condition for the three-step-grown AN buffer layer 20T satisfying the above requirements includes a growth temperature of 1100° C. and a V/III ratio of 5000 for growing the surface protection layer 22 to have a thickness of 30 nm. Following that, the dislocation blocking layer 24 is formed at a growth temperature 1200° C. and a V/III ratio of 50 to have a thickness of 1 Then the smoothing layer 26 is grown at a growth temperature of 1200° C. and a V/III ratio of 50 to have a thickness of 2 μm.

Figure 8:
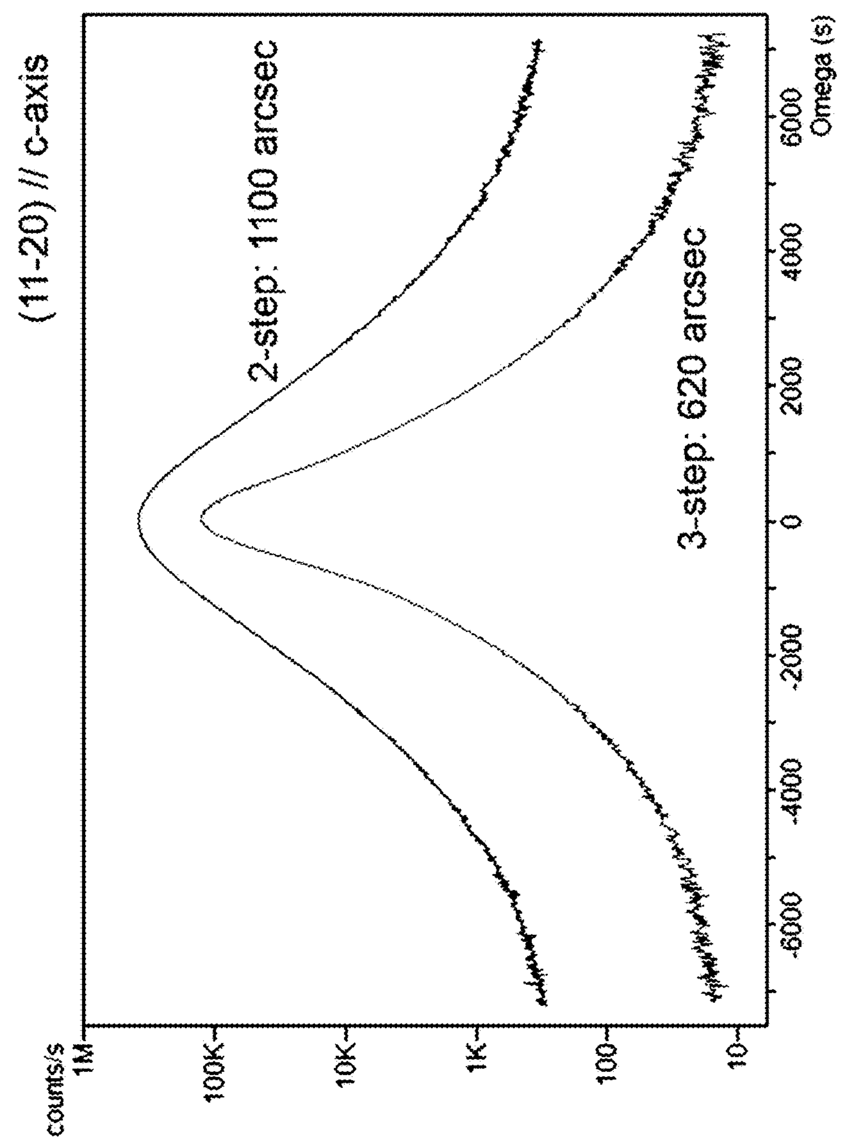
FIG. 8 is a graph indicating X-ray rocking curve plotted for a three-step-grown AlN buffer layer of a non-polar plane obtained through a typical condition in an embodiment of the present invention.

FIG. 8 is a graph indicating X-ray rocking curve regarding c-axis on (11-20) plane, which is one of planes parallel to c-plane, plotted for a three-step-grown AlN buffer layer 20T of a non-polar plane obtained through a typical condition mentioned above. For comparison purposes, a curve for the two-step-grown AlN buffer layer 20D (FIG. 1) without dislocation blocking layer is also plotted. The comparison by the FWHM values shows that the peak for the two-step-grown AlN buffer layer 20D is 1100 arcsec, whereas one for the three-step-grown AlN buffer layer 20T is 620 arcsec. Although it is not indicated in the drawings, we have also confirmed based on another crystal plane or (10-11) plane that an FWHM value of 2500 arcsec without dislocation blocking layer was decreased to 1200 arcsec by adopting the dislocation blocking layer. From these results, we confirmed that crystallinity was considerably improved in actuality for the three-step-grown AlN buffer layer 20T having a dislocation blocking layer 24 added. In particular, we confirmed that a good quality template could be realized by a three-step-grown AlN buffer layer 20T than a two step-grown AlN buffer layer 20D, since only the three-step-grown AlN buffer layer 20T could reach below 1000 arcsec in the X ray rocking curve for the c-axis on (11-20) plane.

Surface roughness on the top-most surface of the three-step-grown AlN buffer layer 20T was substantially the same as that of the two-step-grown AlN buffer layer 20D. That is, roughness of the surface of the smoothing layer obtained with the dislocation blocking layer 24 is not affected by the dislocation blocking layer 24, and RMS roughness value for the surface of the smoothing layer would be measured to be around 2 nm.

Detailed underlying phenomena in the growth process of the dislocation blocking layer 24 should be as follows. The dislocation blocking layer 24 is grown while being sufficiently coherent with the sapphire crystal plate 10 via the surface protection layer 22. During this growth, uneven surface profile due to the island structure (FIG. 2) on a surface of the surface protection layer 22 is replicated; as a result, small pieces of planes of various lattice planes, or facets, continue to grow while each facet grows at their own growth rate. Although a macroscopic plane of the growing AlN layer is (11-20) plane, facets of a (10-1-2) plane orientation grows faster while they form inclined planes tilted from the macroscopic plane. Due to such a fast growth rate of the facets of (10-1-2) plane, the dislocation blocking layer 24 continue to grow while it buries small islands on the surface protection layer 22, thereby dislocations, a type of crystallographic defects, extend toward directions biased from the perpendicular direction (plane normal direction) of the macroscopic plane of the dislocation blocking layer 24. Since each of the facets is aggregated with one another, or with one grown from different direction, the number of dislocations during the growth of the dislocation blocking layer 24 is reduced by the aggregation. That is, the dislocation blocking layer 24 grown with an appropriate condition may reduce the number of the dislocation sufficiently only by growing it to have a certain thickness, which improves the crystallinity. Although it is possible that the unevenness due to the island structure may be replicated to a surface or even that the unevenness may be enhanced, such should be preferable nature in blocking dislocations and will not cause substantial problem, as a sufficient flatness will be achieved by the smoothing layer 26 to be formed later.

As stated above, operability of a non-polar plane AlN buffer layer having a good crystallinity and good flatness, such as sharp peak of 620 arcsec in FWHM for an X-ray rocking curve with (11-20) plane and a reduce roughness of 2 nm in RMS value, was demonstrated.

One of key indicators in dislocation blocking capability through the growth of the dislocation blocking layer 24 is how thick is required for the thickness D2 of the dislocation blocking layer 24 to reduce the number of threading dislocation to a desired level. A value representing a degree of fineness of the surface and having a dimension of length would be an indicator measure for determining preferable range of the thickness D2 of the dislocation blocking layer 24. For example, a size characterizing the island structure of the surface protection layer may be a possible indicator.

Figure 9:
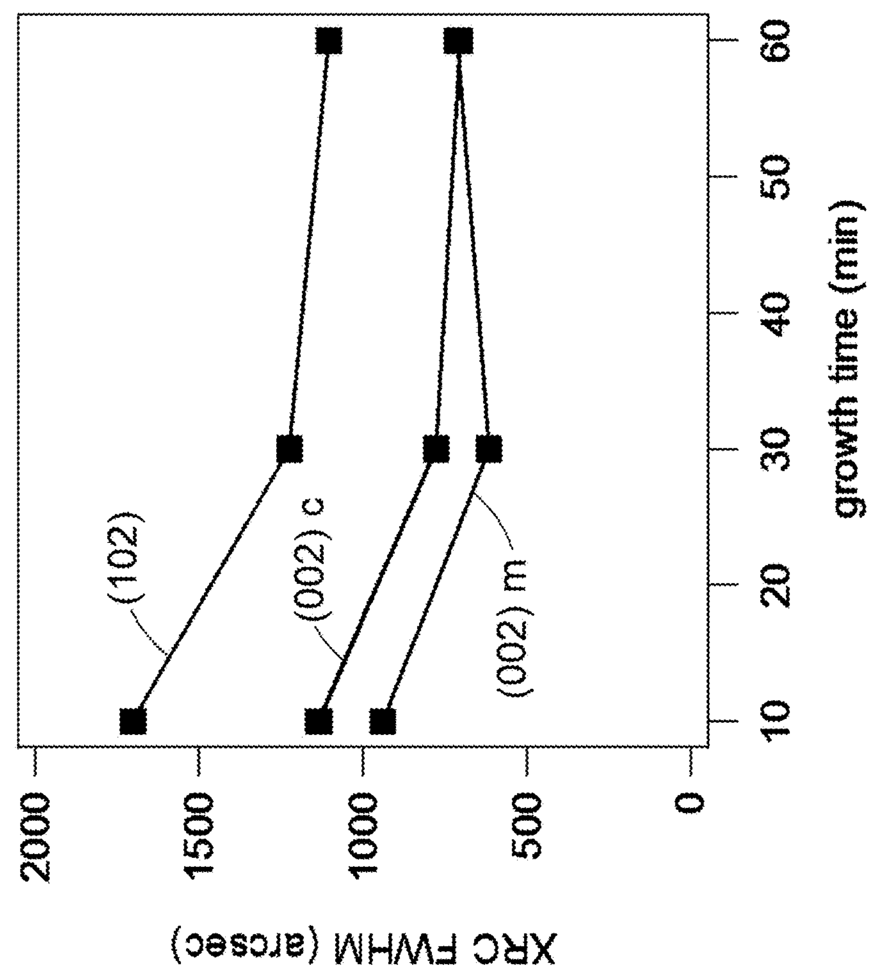
FIG. 9 is a graph indicating peak widths, in FWHM values, of X-ray rocking curves obtained from samples for a dislocation blocking layer with growth time varied in an embodiment of the present invention.

We then studied crystallinity change according to the thickness D2 of the dislocation block layer 24. FIG. 9 is a graph indicating peak widths, in FWHM values, of several diffraction peaks of X-ray rocking curves obtained from samples for a dislocation blocking layer 24 with growth time varied. The samples from which the X-ray rocking curves are measured had the dislocation blocking layer 24 without a smoothing layer 26. The growth conditions of the layers were at a substrate temperature of 1100° C. and a V/III ratio of 5000 for the surface protection layer 22 of a thickness of 30 nm and a substrate temperature of 1200 degree-C. and a VIII ratio of 50 for the dislocation blocking layer 24, which was epitaxially grown through the MOCVD process to have a thickness depended on growth time as indicated on the horizontal axis of the graph. The same growth condition for the surface protection layer 22 was adopted, whereas the same growth condition for the dislocation blocking layer 24, except the growth time, was adopted for the samples. Thus the growth time along the horizontal axis of the graph is substantially proportional to the thickness D2 of the dislocation blocking layer 24; growth time of 10, 30, and 60 minutes correspond to the thickness D2 of 0.3 μm, 1 μm and 2 μm, respectively. Here, a label of "(002) c" indicates that the associated peak has been obtained from a rocking curve around c-axis at a diffraction peak of (002). Similarly, "(002) m" means around m axis at a diffraction peak of (002), and "(102)" means a diffraction peak of (102).

The foregoing result shows that the crystallinity is improved as a whole as the thickness D2 of the dislocation blocking layer 24 increases from 0.3 μm to 2 μm. Therefore, it can be said that the dislocation blocking capability expected to the dislocation blocking layer 24 becomes reliable as the thickness increases. To be more specific, the crystallinity is notably improved as the thickness D2 of the dislocation increases from 0.3 μm to 1 μm, but it remains almost unchanged as the thickness reaches to 2 μm thereafter. Therefore, we found that dislocation blocking capability of the dislocation blocking layer 24 is also improved until the thickness D2 reaches 1 whereas the improvement of the capability will be saturated around the thickness of 1 Since good crystallinity means reduced density of crystallographic defects, or threading dislocations, throughout the thickness of the surface protection layer 22, it has been confirmed that sufficient the dislocation blocking capability of the dislocation blocking layer 24 can be achieved by the thickness of around 1 This analysis shows that not only it is preferable to grow the dislocation blocking layer 24 to have a thickness of around 1 μm for taking advantage of the capability with short growth time, but it also preferable to grow the dislocation blocking layer 24 to have a thickness of 1 μm or more with a certain tolerance in the case when no constraint is required for the growth time. It should be noted that the island structure on the surface of the surface protection layer 22 has a number of islands of AlN domain, which can be characterized by their submicron size, as can be found in the AFM micrographs in FIGS. 2A and 2B. As stated above, it has been confirmed that unevenness effect of the island structure on the surface protection layer 22 is mitigated by the dislocation blocking layer 24 of a thickness of around 1 which is several times of characterizing size of the islands, and that the dislocation blocking capability saturates at such a thickness. When characterizing size of the islands on the surface protection layer 22 is different from the above, the lower limit defining a preferable range for the thickness of the dislocation blocking layer 24 will be changed from around 1 μm to another accordingly.

It is possible to determine preferable thickness values for the other layers in the three-step-grown AlN buffer layer 20T. The growth temperature for the surface protection layer 22 is set so that the roughening of the underlying surface of the sapphire crystal plate 10 may be prevented. Then the thickness D1 of the surface protection layer 22 may be so determined that the roughness of the sapphire crystal plate 10's surface does not enhance the top-most surface of the three-step-grown AlN buffer layer 20T. A thickness corresponding to this requirement is very thin and 30 nm would be sufficient as stated above. The thickness D3 of the smoothing layer 26 may be so determined that it gives sufficient flatness. How much roughness remains after formation of the smoothing layer 26 depends on the thickness D3. Therefore, the thickness D3 of the smoothing layer is concluded to be suitable if the surface of the three-step-grown AlN buffer layer 20T after disposing the smoothing layer 26 on the surface of the dislocation blocking layer 24 having a certain level of unevenness is found to be a flattened surface.

2. Second Embodiment: Devices with AlGaN Layer

Next, growth method of a non-polar AlGaN layer, the second embodiment of the present application, will be described. FIG. 10 is a schematic diagram illustrating a structure in the case when a non-polar AlGaN layer 30 of a-plane is grown on either surface of a crystal substrate 1D or 1T having a two- or three-step-grown AlN buffer layer 2D or 2T of a-plane, each of which is formed on a sapphire crystal plate 10 of r-plane. An AlGaN layer or an AlN buffer layer described herein will be assumed to have an a-plane orientation and a sapphire crystal plate to have an r-plane orientation, unless otherwise noted. An AlGaN layer 30 uses an AlN buffer layer of an a-plane orientation, such as the two- and three-step-grown AlN buffer layers 20D and 20T in the first embodiment, or a non-polar AlN crystal surface of some other kind for its template. The AlGaN layer 30 is grown for a device manufactured thereon that requires such an AlGaN layer, such as an LED device; therefore, in addition to the crystal quality necessary for device manufacturing, a desired Al composition ratio must be realized in the AlGaN layer 30.

2-1. Flatness

Experiments were conducted for determining growth conditions of the AlGaN layer 30 indicated in FIG. 10, by changing a growth temperature in a relatively high temperature range of 1200 through 1400° C. and changing a V/III ratio in a range between 2.5 through 250. Each sample was fabricated by using the two-step-grown AlN buffer 20D (FIG. 1) that does not have any dislocation blocking layer 24. It is to be noted that a common growth temperature for AlGaN layer is below 1200° C.

FIGS. 11A and 11B depict SEM micrographs of top-most surfaces of −2 μm thick AlGaN layers 30 grown with a V/III ratio of 25 at 1200° C. and 1300° C. respectively. It was confirmed that a flat surface could be produced at a relatively high growth temperature (1300° C. or above; FIG. 11B) in the case when a non-polar plane is adopted for the AlGaN layer 30. That is, a large number of facets of (1-101) plane are present when the growth temperature was set to 1200° C. as in FIG. 11A, and the resulting surface was roughened accordingly. Specifically, the roughening became prominent when the Al composition was decreased. In contrast, a flat surface was realized at 1300° C. over an entire range of material supply ratio for increased Al compositions.

2-2. Control of AlN Mixed Crystal Composition Ratio

Figure 12:
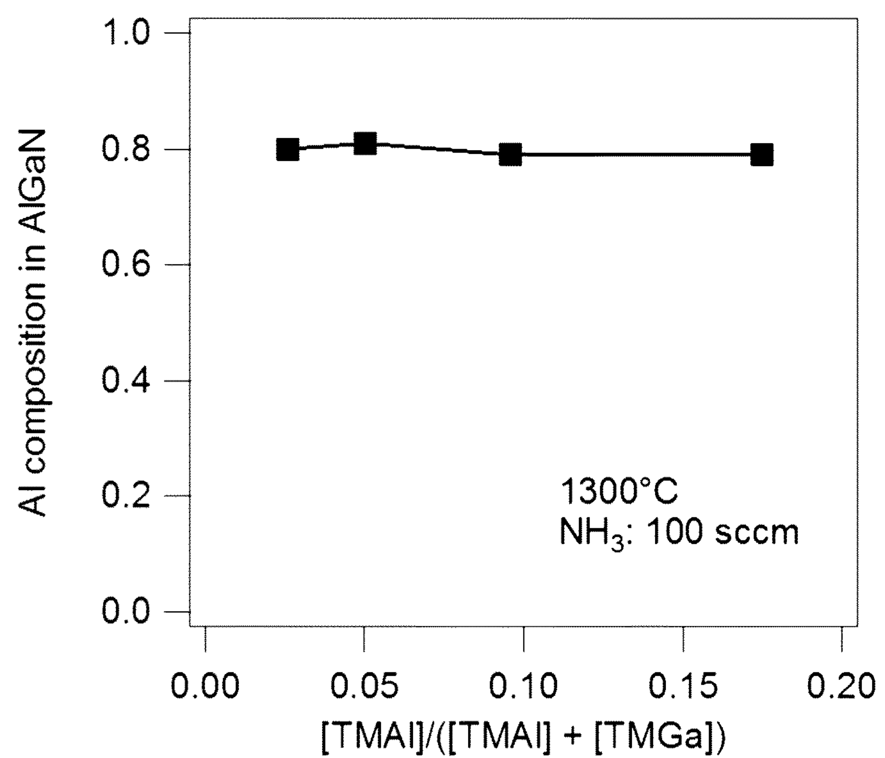
FIG. 12 is a graph indicating an AlN mixed crystal composition ratio obtained for layers grown in conditions that have different material supply ratios between TMAl and TMGa, while a growth temperature and an $NH_3$ flow rate are fixed in an embodiment of the present invention.

For the purpose of controlling the Al composition, a material supply ratio in raw material gas was changed between gases for aluminum and gallium, or tri-methyl-aluminum (TMAl) and try-methyl-gallium (TMGa) respectively, which revealed that it was difficult to control the Al composition by the change of the material supply ratio alone. FIG. 12 is a graph indicating an AlN mixed crystal composition ratio obtained for layers grown in conditions with different material supply ratios between TMAl and TMGa, while a growth temperature and an $NH_3$ flow rate are fixed to 1300° C. and 100 sccm, respectively. The horizontal axis represents a flow rate of TMAl divided by a total flow rate of TMAl and TMGa, and the vertical axis represents an AlN mixed crystal composition ratio. We have supposed the reason why the AlN mixed crystal composition ratio did not reflect the change of the material supply ratio, in spite of so drastic change in the ratio, was due to dominant desorption of Ga caused by its high vapor pressure in a high temperature environment, such as 1300° C.

To be more specific, the Al composition x is expressed by the flowing formula.

$$x = \frac{P^{\circ}_{Al}}{P^{\circ}_{Ga} + P^{\circ}_{Al}} \quad \text{[Math 1]}$$

$P_{Ga}{}^{\circ}$, $P_{Al}{}^{\circ}$: partial pressures for raw materials

In this regard, if the desorption of Ga is significant at a high temperature, the Al composition x is determined by the following formula.

$$x = \frac{P^{\circ}_{Al}}{(P^{\circ}_{Ga} - P_{Ga}) + P^{\circ}_{Al}} \quad \text{[Math 2]}$$

$P_{Ga}$: partial pressure corresponding to Ga desorption

Figure 13B:
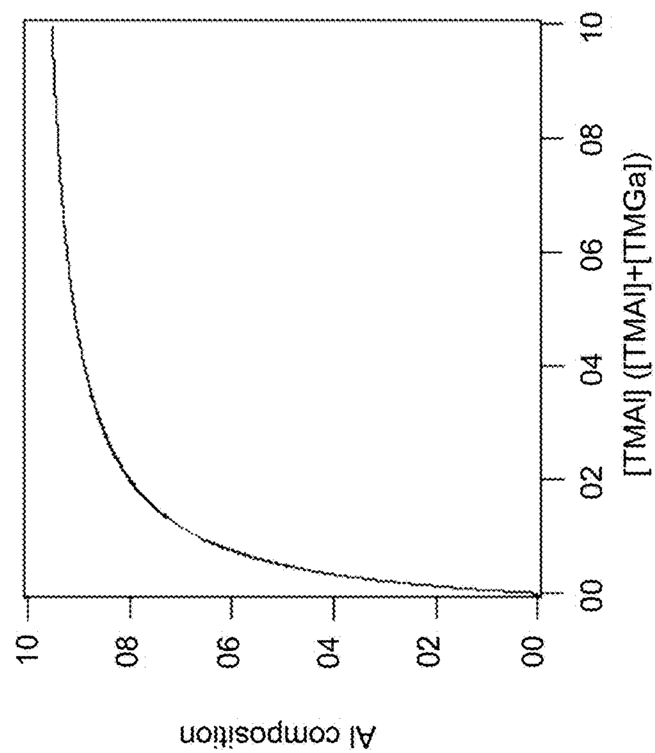
FIGS. 13A and 13B are graphs indicating theoretically calculated values for relationships between a material supply ratio and an Al composition ratio x in cases when Ga desorption is negligible and significant, respectively.
Figure 13A:
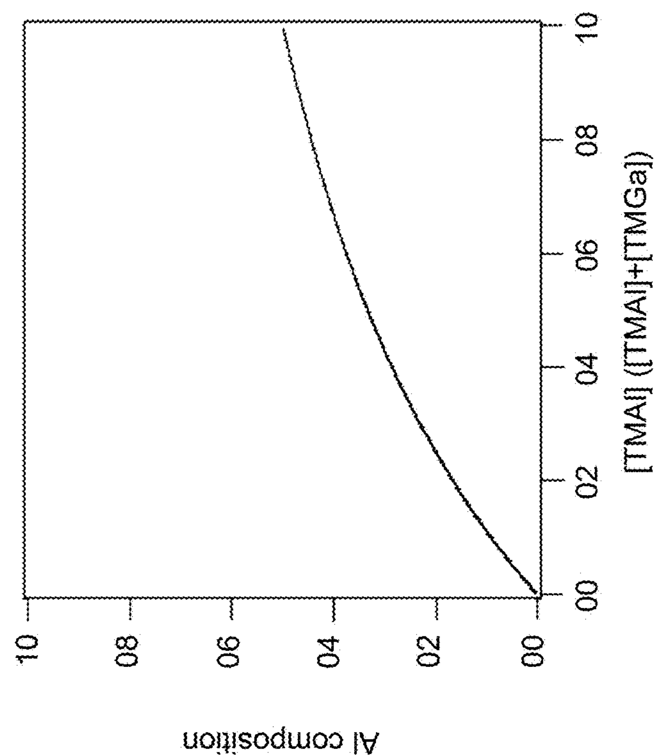

FIGS. 13A and 13B are graphs indicating theoretically calculated values for relationships between a material supply ratio and an Al composition ratio x in cases when Ga desorption is negligible and significant respectively. In the case when Ga desorption is negligible, the Al composition ratio x varies almost proportionally to a material supply ratio, whereas in the case when Ga desorption is significant, the Al composition ratio x increases sharply in a low material supply ratio range, or below ~0.2 along the horizontal axis, and varies slowly thereafter. It follows that in the case when the Ga desorption is significant response in controlling the Al composition ratio x by changing conditions of the material supply ratio is too sensitive over a very low material supply ratio range and too insensitive for the rest of the range.

We therefore conducted an equilibrium based analysis to establish a scheme of controlling the composition ratio that is applicable to significant Ga desorption case. The growth reaction of AlN at gas/solid interface is expressed as $$Al(g)+NH_3(g)=AlN(s)+3/2H_2(g)$$

according to molecular species relevant to the growth reaction. Similarly, the growth reaction of GaN is also expressed as $$Ga(g)+NH_3(g)=GaN(s)+3/2H_2(g).$$

The reaction rate is calculated according to law of mass action, which is expressed commonly for III-N system, i.e., AlN or GaN, in a following formula.

$$K = \frac{a_{III-N} \cdot P_{H_2}^{3/2}}{P_{III} \cdot P_{NH_3}} \quad \text{[Math 3]}$$

Here $a_{III-N}$ denotes an activity for III-N system, or AlN and GaN, and P denotes a partial pressure for material indicated by the subscript associated. Since the equilibrium constant K is kept to a constant value, it can be said that increase of the $NH_3$ partial pressure $P_{NH3}$ shifts the equilibrium to the right hand side in the reaction, which makes Ga desorption difficult. Consequently, controlling $P_{NH3}$ should be promising for adjusting the composition ratio between elements with weak desorption, or Al, and significant desorption, or Ga.

Figure 14:
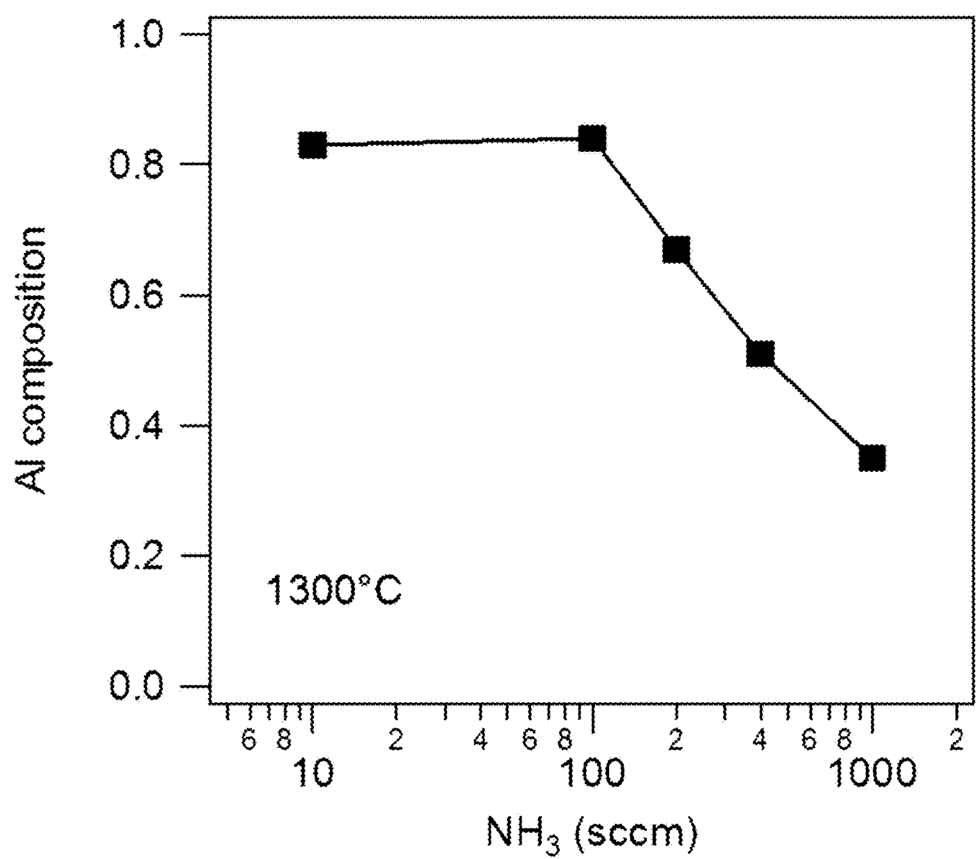
FIG. 14 is a graph indicating Al composition ratios vs NH3 supply amount in an embodiment of the present invention.

Bearing the above analysis in mind, we carried out experiments for adjusting the $NH_3$ partial pressure $P_{NH3}$ by controlling the VIII ratio. FIG. 14 is a graph indicating Al composition ratios vs $NH_3$ supply amounts. The growth temperature was fixed to 1300° C. and the other conditions, including a ratio between TMAl and TMGa, were also unchanged. As clearly indicated in the graph of FIG. 14, the Al mixed crystal composition ratio along the vertical axis was dependent on the $NH_3$ supply amount in a clear broken line manner against the horizontal axis. Specifically, in a low V/III ratio range with an $NH_3$ supply amount of 100 sccm or below, the AlN composition ratio kept a high constant value due to failure to suppress the Ga desorption. In contrast, in a high V/III ratio range with an $NH_3$ supply amount above 100 sccm, the AlN composition decreased as the $NH_3$ supply amount increased. The controlling capability enabling adjustment of the Al composition ratio to a desired value just by controlling the $NH_3$ supply amount will be extremely useful in a manufacturing process for AlGaN composition devices, especially in crystal growth process for manufacturing a quantum well structure by modulating the Al composition ratio.

It is possible to combine control by an Al composition ratio using an $NH_3$ supply amount with control by a material supply ratio between TMAl and TMGa. This is because only sufficient amount supply of $NH_3$ is required if we are going to shift the dependency from one in FIG. 13B, in which the control is difficult, into another in FIG. 13A, in which the control based on the material supply ratio becomes easy. That is, assume as an example that an MOCVD method at a temperature over 1200° C. is adopted for ensuring flatness throughout the growth in a crystal growth process using Al composition ratio modulation for manufacturing a quantum well structure. If a partial pressure of ammonia gas in the raw material gas is sufficiently increased for the MOCVD method in that condition, it becomes possible to control the Al composition ratio in the grown crystal according to the material supply ratio.

Figure 15:
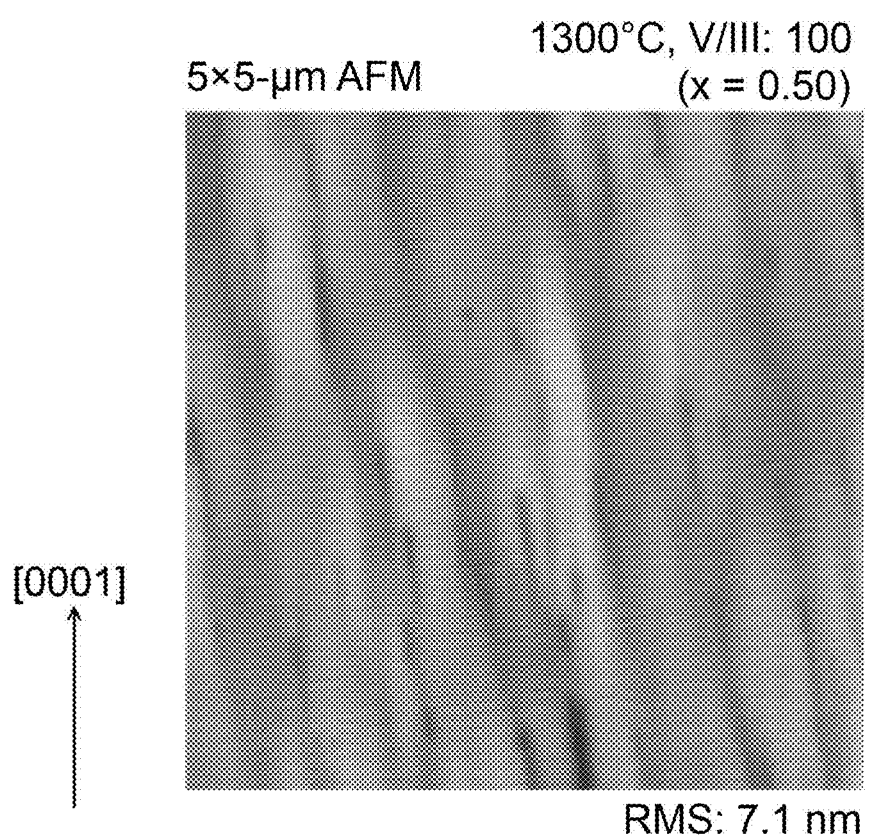
FIG. 15 is an AFM micrograph of a surface of AlGaN layer formed in an embodiment of the present invention.

Next, surface observation was carried out for confirming whether a flat surface as indicated in FIG. 11B in a high temperature growth could be obtained with a different Al composition ratio. This is because the flatness can be an indicator measure as to whether the non-polar plane AlGaN grown at a high temperature can be adopted or not, as the flat surfaces obtained during the growth for the devices having the quantum wells will produce flat and smooth interfaces among layers of such quantum wells. FIG. 15 is an AFM micrograph of a surface of an AlGaN layer 30 that was formed to have a 1.5 μm thickness with a growth condition identical to 1300° C., a V/III ratio of 100:1, and an Al composition ratios x of 0.5 for barriers and 0.4 for a well. The AFM micrograph was captured over 5×5 μm area. A relatively flat non-polar plane AlGaN was obtained as indicated in FIG. 15, whose RMS roughness was measured to be 7.1 μm.

An AlGaN layer 30 with a good flatness was grown by way of the two-step-grown AlN buffer layer 20D as described above. Also, a scheme for controlling Al composition ratio in the AlGaN layer 30, where the scheme is consistent with growth condition of the three-step-grown AlN buffer layer 20T, was devised. Although the AlGaN layer 30 used in the experimental confirmation was an example of the two-step-grown AlN buffer layer 20D, we can expect that the same flatness and more good crystallinity should be realized on a non-polar AlGaN grown on a template of the non-polar three-step-grown AlN buffer layer 20T with the dislocation blocking layer 24.

2-3. Confirmation of UV Emission Operation and Structure of UV Emission Device

The present inventors confirmed through an experiment that UV emission could be achieved with a quantum well structure that was manufactured by the crystal growth scheme mentioned above. A sample having the quantum well structure fabricated in the experiment, or emission test sample, was one adopting a crystal substrate with non-polar AlN buffer layer formed on a surface of a sapphire crystal plate, which has a non-polar AlGaN with a flat interface, and having a quantum well structure fabricated through modulating a composition of the non-polar AlGaN. The emission test sample was made for studying fabrication quality of the crystal or the quantum well structure through UV emission performance; a complete structure of light-emitting diodes (LEDs) was not fabricated into the emission test sample.

Figure 16A:
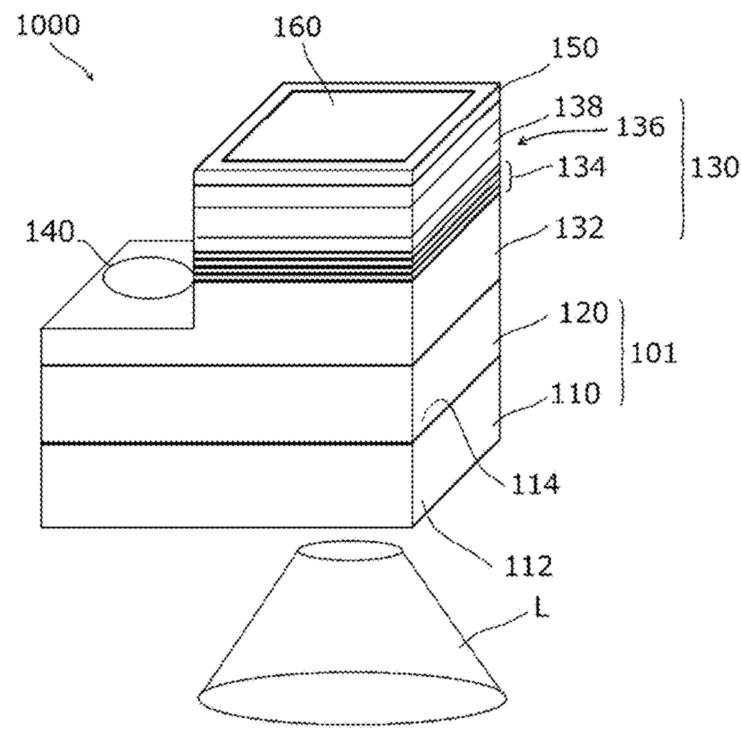
FIGS. 16A and 16B depict schematic diagrams illustrating structures of a UVLED provided in an embodiment of the present invention, in a perspective view and a schematic cross-sectional view, respectively.
Figure 16B:
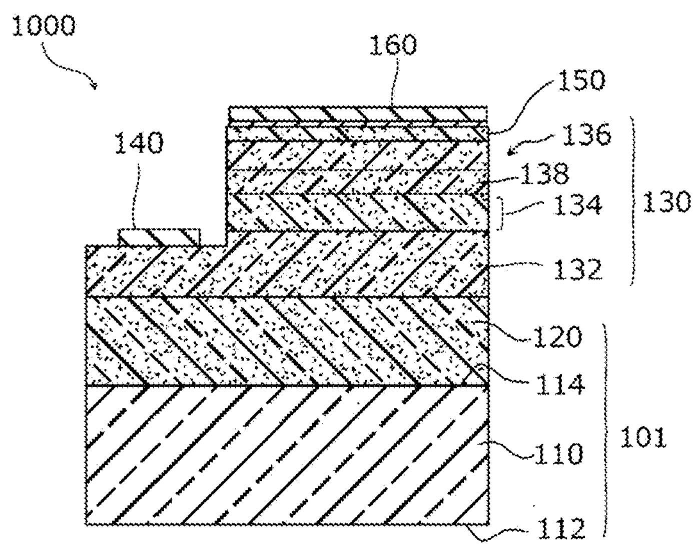

FIGS. 16A and 16B depict schematic diagrams illustrating structures of a UVLED 1000 provided in the embodiment, a perspective view and a schematic cross-sectional view respectively. For manufacturing the UVLED 1000, an AlN buffer layer 120 is epitaxially grown to have a crystal orientation of a-plane in a same manner as one of the two- and three-step-grown AlN buffer layers 20D and 20T (FIGS. 1 and 7, respectively) on one surface 114 of a sapphire crystal plate 110 of r-plane, a non-polar plane, made of a substantially plate shaped $\alpha$-$Al_2O_3$ single crystal. The crystal substrate 101 is fabricated in this manner. The crystal substrate 101 has the same structure as the crystal substrate 1D (FIG. 1). The UV emission layer 130, in which composition for each layer is controlled by applying the controlling scheme of the Al composition ratio using $NH_3$, is disposed directly on an AlN buffer layer 120 placed top-most surface of the crystal substrate 101, where the scheme was confirmed in the AlGaN layer 30 (FIG. 10). The crystal of the UV emission layer 30 is also epitaxially grown on the AlN buffer layer 120. The structure of the UV emission layer 130 has an n-type conduction layer 132, a recombination layer 134, and a p-type conduction layer 136, stacked in this order from the AlN buffer layer 120 side. Material for the UV emission layer 130 typically has a composition of AlGaN or that doped with a small amount of dopant element (e.g., Si for n-type conduction and Mg for p-type conduction). A first electrode 140 is electrically connected with the n-type conduction layer 132. On the other hand, a p-type contact layer 150 and a reflective electrode 160, which is used as a second electrode, are electrically connected with a p-type conduction layer 136. The reflective electrode 160 may be made of a layered film, as necessity, that has reflection capability and ohmic contact capability. The electrical connection is established with the p-type conduction layer 136 via the p-type contact layer 150. Then optical output L is irradiated from a light extraction surface 112, which is the other side of the sapphire substrate 110.

Preferably, the AlN buffer layer 120 is made to have a good crystallinity as in the three-step-grown AlN buffer layer 20T by disposing the dislocation blocking layer 24; however, it is possible to fabricate a sufficiently good quantum well structure in the UV emission layer 130 by growing the surface protection layer 22 and the smoothing layer 26 only, without disposing the dislocation blocking layer 24, as in the two-step-grown AlN buffer layer 20D. The AlN buffer layer 120 is grown to have a thickness of 2-3 μm or the like, for example. As for the UV emission layer 130, the n-type conduction layer 132 is made of $Al_{0.60}$ $Ga_{0.40}$ N layer doped with Si for n-type conduction, or $Al_{0.60}$ $Ga_{0.40}$ N; Si layer. The recombination layer 134 has an MQW (multi-quantum well) layered structure that is a stack of thin films of compositions of $Al_{0.60}$ $Ga_{0.40}$ N and $Al_{0.53}$ $Ga_{0.47}$ N to form a superlattice structure, where the number of layers is around 3, for example. The p-type conduction layer 136 is an AlGaN; Mg layer, or an AlGaN layer doped with Mg for p-type conduction. The UVLED 1000 of the present embodiment may optionally have an electron blocking layer 138 in the p-type conduction layer 136. The electron blocking layer 138 in such a case may be made into an MQB structure. The p-type contact layer 150 is made of material, for example, of GaN; Mg, or gallium nitride doped by magnesium, or material containing Al, or a mixed crystal of AlN and GaN, or AlGaN, doped with Mg. The first electrode 140 is a metal electrode of a stack structure of Ni/Au from the bottom side. The sub-layer of Ni in this structure is a thin layer of 25 nm thick, for example, inserted for securing ohmic contact between Au and underlying semiconductor layer. The UVLED 1000 of the above-mentioned structure is manufactured for the present embodiment.

Figure 17:
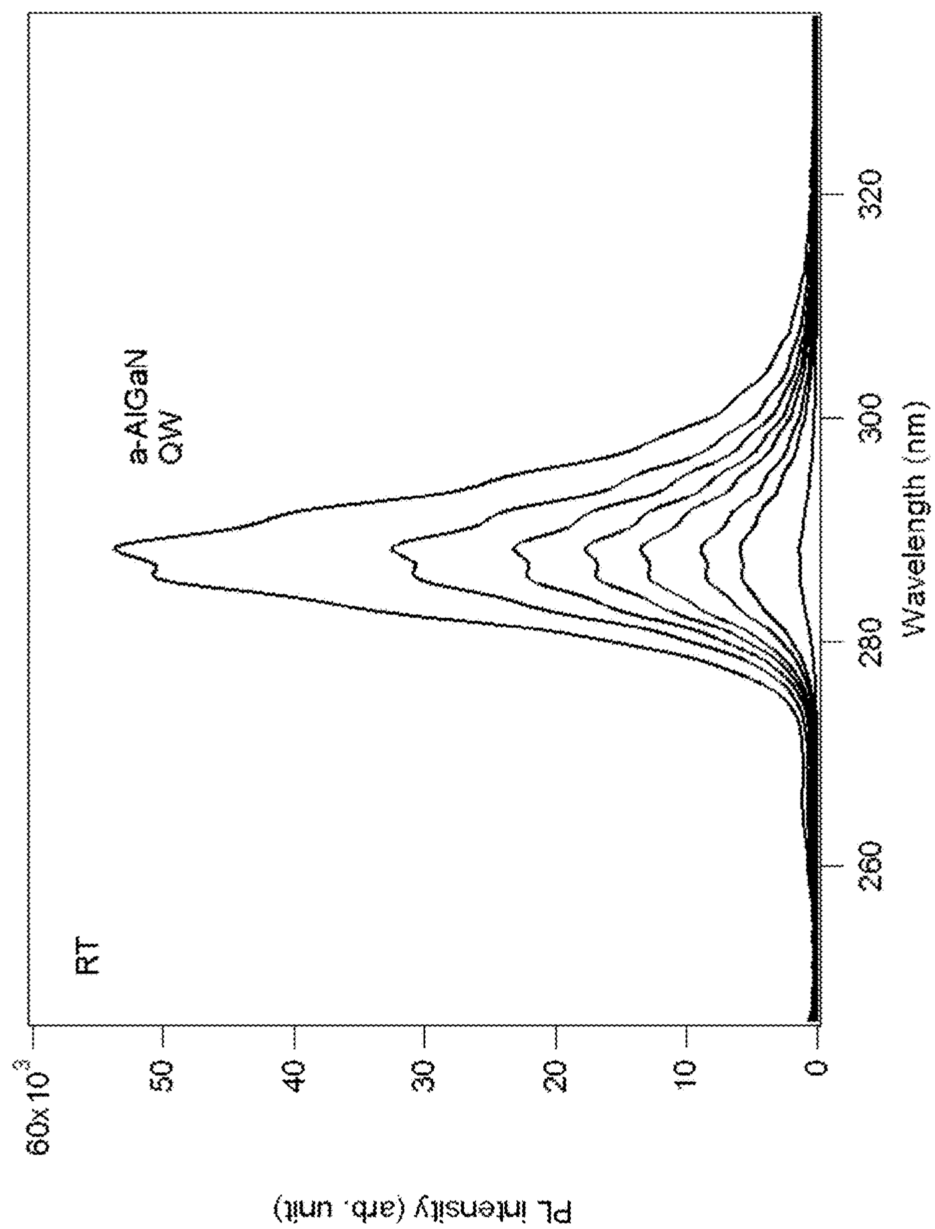
FIG. 17 depicts emission spectra at room temperature for a plurality of excitation illuminances obtained from an emission test sample in an embodiment of the present invention.

The emission test sample for testing the UV emission operation was manufactured until they have the UV emission layer 130 of the UVLED 1000, where the n-type conduction layer 132 was made to have an $Al_{0.60}$ $Ga_{0.40}$ N layer without Si doping. The recombination layer 134 for the sample included the quantum well as stated above including an MQW (multi-quantum well) layered stack. However, the p-type conduction layer 136, electron blocking layer 138, and electrodes were omitted in the sample fabrication. FIG. 17 depicts emission spectra at room temperature for a plurality of excitation illuminances obtained from an emission test sample. As indicated in FIG. 17, emission in UV-C region from the quantum well structure fabricated by a non-polar AlGaN composition was observed with a peak wavelength around 287 nm. The emission intensities were dependent on the excitation illuminances in the emission behavior at the several excitation illuminance values; however no shift or dependence was observed in the emission spectral shapes or in the peak wavelengths. Such a UV-C range emission performance that features properties of the non-polar AlGaN composition has never been reported yet. The present inventors conclude that emission operation of the emission test sample fabricated for confirming performances of the UVLED 1000 was actually achieved as intended when adopting a non-polar plane, and that the quantum well structure was fabricated as intended.

2-4. Variation 1: AlN Crystal Substrate

The second embodiment include Variation 1, which adopts an AlN crystal substrate of a-plane orientation in place of the sapphire crystal plate 110. All the contents of description in case for the sapphire crystal plate 110 described above are incorporated herein by reference in their entirety for the description of the present variation for adopting AlN crystal substrate. In this variation, the AlN buffer layer 120 may be omitted. The UV emission layer 130 of the variation 1 is fabricated by epitaxial growth of AlGaN in a similar way as one in FIG. 16, and is disposed in contact with an r-AlN crystal of the substrate or an buffer layer (if applicable). When such an AlN crystal substrate is used, we can expect effect of controlling the Al composition in AlGaN by the supply amount of $NH_3$.

3. Variation 2: Application to Electronic Apparatus

An ultraviolet emitter of improved efficiency with the features of UVLED 1000 in the second embodiment also brings advantages to electric apparatus having the same. The electric apparatus in this context may be of any type and is not limited specifically. A non-limiting list of such apparatus includes, for example, sterilization device, water-purification device, chemical decomposing device (including exhaust gas cleaning device), and information recording/play back device. When a highly efficient UV emitter is obtained, electric power necessary in operating these devices would be suppressed, which provide us with reduced environmental load as well as suppressed running cost. Also, if the efficiency of an emitter is increased, not only the number of emitters in a unit of such electric apparatus, but complexity of structure in cooling equipment or driving power source is reduced. This contributes to make construction of electric apparatus compact and light weight, and decrease manufacturing cost.

3. Conclusion

The first embodiment of the present invention provides technology related to a non-polar AlN buffer layer. The non-polar AlN buffer layer has been realized in a crystal substrate, by suppressing roughening a surface of r-sapphire crystal plate and smoothing the surface thereafter. In addition, it has been confirmed that dislocations in the crystal lattice can be blocked. The second embodiment provides technology related to a non-polar AlGaN buffer layer. I has been confirmed that an Al composition ratio can be controlled according to a NH3 flow rat. In addition, a UV light-emitting device of non-polar AlGaN has been actually manufactured with a quantum well structure, and actual radiation in UV-C range was confirmed. These technologies are important in realizing a UV light-emitting device, especially for practical non-polar DUVLED.

The embodiments of the present invention has been described specifically throughout the description set forth herein. Any parts of the description in this specification, including the embodiments and practical working examples are provided for the purpose of explaining the present invention; thus the scope of the invention should be determined based on recitations of the claims. Furthermore, any other variations based on any combination in the embodiment should be considered in the present invention, which variations should be also within a scope of the present invention.

INDUSTRIAL APPLICABILITY

The crystal substrate of the present invention is a useful component for growing crystal thereon. The UV light-emitting device of the present invention is applicable to any electric appliances that use ultraviolet radiation.

REFERENCE SIGNS LIST

1D, 1T, 101 crystal substrate
1000 UV light-emitting diode (UVLED), UV light-emitting device
112 light extraction surface
114 surface of a sapphire crystal plate
10, 110 r-sapphire substrate
20D, 120 two-step-grown AlN buffer layer
20T three-step-grown AlN buffer layer
22 surface protection layer
24 dislocation blocking layer
26 smoothing layer
30 AlGaN layer
130 UV emission layer
132 n-type conduction layer
134 recombination layer
136 p-type conduction layer
138 electron blocking layer
140 first electrode
150 p-type contact layer
160 reflective electrode

What is claimed is:

1. A method for manufacturing a crystal substrate of a non-polar orientation comprising the steps of:
providing a sapphire crystal plate of an r-plane orientation; and
forming a buffer layer of an AlN buffer layer, so that the AlN buffer layer covers at least a part of a surface of the sapphire crystal plate, the AlN buffer layer being an epitaxially grown layer of AlN crystal of a non-polar orientation,
wherein the step of forming a buffer layer includes the steps of:
forming a surface protection layer directly on the part of the surface of the sapphire crystal plate by epitaxially growing a surface protection layer that suppresses roughness on a surface of the AlN buffer layer; and
smoothing by epitaxially growing a smoothing layer on or over the surface protection layer for providing a surface of the AlN buffer with a smoothed upper surface,
wherein the step of forming the surface protection layer is carried out by an MOCVD method at a growth temperature that is below a temperature at which a surface of the r-plane of the sapphire crystal plate may be roughened,
wherein the step of smoothing is carried out by an MOCVD method at a growth temperature that reaches or exceeds a temperature necessary for smoothing, and
wherein the temperature necessary for smoothing is above the growth temperature for the step of forming the surface protection layer and is above 1400° C.

2. The method for manufacturing a crystal substrate according to claim 1,
wherein the step of forming a buffer layer further includes a step of forming a dislocation blocking layer that reduces a number of crystallographic defects through the AlN buffer layer between the steps of forming the surface protection layer and the smoothing, and
wherein the step of smoothing is epitaxially growing the smoothing layer on or over the dislocation blocking layer, so that the smoothing layer covers at least a part of the surface protection layer via the dislocation blocking layer.

3. The method for manufacturing a crystal substrate according to claim 1,
wherein the growth temperature for the step of forming a surface protection layer is 1200° C. or below.

4. The method for manufacturing a crystal substrate according to claim 2,
wherein the step of forming a surface protection layer is carried out by an MOCVD method at a growth temperature that is below a temperature at which the r-plane of the sapphire crystal plate may be roughened,
wherein the step of forming a dislocation blocking layer is carried out by an MOCVD method,
wherein the step of smoothing is carried out by an MOCVD method at a growth temperature that reaches or exceeds a temperature necessary for smoothing, where the temperature necessary for smoothing is above the growth temperature for the step of forming a surface protection layer, and
wherein the MOCVD method for the step of forming a dislocation blocking layer is carried out at a temperature that is identical or above the growth temperature for the step of forming a surface protection layer and below the growth temperature for the step of smoothing.

5. The method for manufacturing a crystal substrate according to claim 4,
wherein the growth temperature for the step of forming a surface protection layer is 1200° C. or below, and
wherein the temperature for the step of forming a dislocation blocking layer is identical to or above the growth temperature for the step of forming a surface protection layer and is 1300° C. or below.

6. The method for manufacturing a crystal substrate according to claim 1,
wherein the step of forming a surface protection layer is carried out with a V/III ratio in a range within which an island structure is formed on a surface of the surface protection layer.

7. The method for manufacturing a crystal substrate according to claim 1,
wherein the smoothing step is carried out with a V/III ratio in a range within which formation of a wave structure and formation of void-like structural defects on a surface of the smoothing layer are both avoided.

8. A method for manufacturing an ultraviolet light emitting device on a crystal substrate comprising steps of:
forming a crystal substrate having a non-polar AlN surface;
forming a group-III nitride semiconductor crystal layer by epitaxially growing an ultraviolet (UV) emission layer of a non-polar plane on at least a part of the non-polar AlN surface of the crystal substrate, the UV emission layer including an n-type conduction layer, a recombination layer, and a p-type conduction layer in this order from the crystal substrate side, all of which are made of group-III nitride semiconductor crystal; and forming a reflective electrode by disposing a reflective electrode directly or indirectly via another layer on the p-type conductive layer, the reflective electrode having a reflection capability for UV radiation that is an ultraviolet light from the UV emission layer, wherein the step of forming the crystal substrate includes a step of forming a buffer layer by forming an AlN buffer layer, so that the AlN buffer layer covers at least a part of a surface of a sapphire crystal plate of an r-plane orientation, wherein the step of forming a buffer layer includes steps of:

forming a surface protection layer directly on the part of the surface of the sapphire crystal plate by epitaxially growing a surface protection layer configured to suppress roughness on a surface of the non-polar AlN surface; and smoothing by epitaxially growing a smoothing layer on or over the surface protection layer for providing a smoothed surface for the non-polar AlN surface, wherein the non-polar AlN surface corresponds to the surface of the AlN buffer layer, wherein the step of forming the surface protection layer is carried out by an MOCVD method at a growth temperature that is below a temperature at which a surface of the r-plane of the sapphire crystal plate may be roughened, wherein the step of smoothing is carried out by an MOCVD method at a growth temperature that reaches or exceeds a temperature necessary for smoothing, and wherein the temperature necessary for smoothing is above the growth temperature for the step of forming the surface protection layer and is above 1400° C.

9. The method for manufacturing an ultraviolet light emitting device according to claim 8, wherein the group-III nitride semiconductor crystal includes a plurality of layers with a mixed crystal of AlN and GaN of different composition ratios, wherein the step of forming a group-III nitride semiconductor crystal layer is a step of performing growth by an MOCVD method at a temperature over 1200° C., while securing flatness through the growth, and wherein the step of forming a group-III nitride semiconductor crystal layer includes a step of controlling the composition ratios by increasing or decreasing a partial pressure of ammonia in material gas for the MOCVD method.

10. The method for manufacturing an ultraviolet light emitting device according to claim 8, wherein the group-III nitride semiconductor crystal includes a plurality of layers with a mixed crystal of AlN and GaN of different composition ratios, wherein the step of forming a group-III nitride semiconductor crystal layer is a step of performing growth by an MOCVD method at a temperature over 1200° C., while securing flatness through the growth, and wherein the step of forming a group-III nitride semiconductor crystal layer includes a step of controlling the composition ratios by adjusting material supply ratios while a partial pressure of ammonia in raw material gas for the MOCVD method is so increased that the composition ratios may be modulated by the material supply ratios between aluminum and gallium in raw material gas at the temperature.

11. The method for manufacturing an ultraviolet light emitting device according to claim 8, wherein the step of forming a buffer layer further includes a step of forming a dislocation blocking layer for reducing a number of crystallographic defects by epitaxially growing a dislocation blocking layer between the step of forming a surface protection layer and the step of smoothing, and wherein the step of forming a surface protection layer is epitaxially growing the smoothing layer over the dislocation blocking layer, so that the smoothing layer covers at least a part of the surface protection layer via the dislocation blocking layer.

12. A method of manufacturing an ultraviolet light emitting device, comprising:

forming an AlN buffer on a sapphire crystal plate having an r-plane orientation, the AlN buffer having a non-polar orientation, the forming of the AlN buffer including:

epitaxially growing, at a first temperature, a surface protection layer directly on the sapphire crystal plate, the first temperature being less than a temperature at which a surface of the r-plane of the sapphire crystal plate is substantially roughened;

epitaxially growing, at a second temperature, a dislocation blocking layer on or over the surface protection layer, the dislocation blocking layer reducing a number of crystallographic defects through the AlN buffer; and epitaxially growing, at a third temperature, a smoothing layer on or over the dislocation blocking layer, the smoothing layer providing a smoothed surface for the AlN buffer, the third temperature being equal to or greater than a temperature necessary to provide the smoothed surface and equal to or greater than 1400° C., the second temperature being equal to or greater than the first temperature, the second temperature being less than the third temperature.

13. The method of claim 12, further comprising:

forming an ultraviolet (UV) emission layer on the AlN buffer, the UV emission layer including an n-type conduction layer, a recombination layer, and a p-type conduction layer.

14. The method of claim 13, further comprising:

forming a reflective electrode on the UV emission layer, the reflective electrode configured to reflect UV radiation.

15. The method of claim 12 wherein the first temperature is equal to or less than 1200° C., and the second temperature is equal to or greater than the first temperature and equal to or less than 1300° C.

* * * * *